(12) United States Patent
Koh

(10) Patent No.: US 6,306,691 B1
(45) Date of Patent: Oct. 23, 2001

(54) BODY DRIVEN SOI-MOS FIELD EFFECT TRANSISTOR AND METHOD OF FORMING THE SAME

(75) Inventor: Risho Koh, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/470,505

(22) Filed: Dec. 22, 1999

Related U.S. Application Data

(62) Division of application No. 08/883,442, filed on Jun. 26, 1997, now Pat. No. 6,049,110.

(30) Foreign Application Priority Data

Jun. 26, 1996 (JP) .................................................. 8-165413

(51) Int. Cl.⁷ .......................... H01L 21/00; H01L 21/336; H01L 21/84
(52) U.S. Cl. .......................... 438/149; 438/164; 438/295; 438/300; 257/347; 257/385
(58) Field of Search .................... 438/149–156, 438/164, 219, 311, 558, 300, 295; 257/347, 280, 281, 350, 385

(56) References Cited

U.S. PATENT DOCUMENTS

| | | | |
|---|---|---|---|
| 5,132,755 | * 7/1992 | Ueno | 357/23.1 |
| 5,198,379 | 3/1993 | Adan | 437/41 |
| 5,359,219 | * 10/1994 | Hwang | 257/351 |
| 5,420,048 | 5/1995 | Kondo | 437/21 |
| 5,427,962 | 6/1995 | Sasaki et al. | 437/41 |
| 5,641,980 | * 6/1997 | Yamaguchi et al. | 657/347 |
| 5,904,508 | * 5/1999 | Codama et al. | 438/151 |
| 5,923,067 | * 7/1999 | Voldman | 257/349 |
| 5,962,892 | * 10/1999 | Takeuchi | 257/327 |
| 5,976,924 | * 11/1999 | Gardner et al. | 438/230 |
| 5,994,759 | * 11/1999 | Darmawan et al. | 257/538 |
| 6,063,675 | * 5/2000 | Rodder | 438/291 |

FOREIGN PATENT DOCUMENTS

| | | |
|---|---|---|
| 49-13117 | 3/1974 | (JP) . |
| 62-26866 | 2/1987 | (JP) . |
| 2-43742 | 2/1990 | (JP) . |
| 6-132309 | 5/1994 | (JP) . |
| 7-335665 | 12/1995 | (JP) . |
| 7-335665 A * | 12/1995 | (JP) .............................. H01L/21/337 |

OTHER PUBLICATIONS

Fariborz Assaderaghi et al., "A Dynamic Threshold Voltage MOSFET (DTMOS) for Ultra–Low Voltage Operation", pp. 809–813, IEEE–IEDM, 1994.

* cited by examiner

*Primary Examiner*—Charles Bowers
*Assistant Examiner*—Erik Kielin
(74) *Attorney, Agent, or Firm*—Young & Thompson

(57) ABSTRACT

In a body driven SOIMOSFET, a semiconductor layer extends over the insulator and comprises a first conductivity type high impurity concentration diffusion layer, a low impurity concentration region and another first conductivity type high impurity concentration diffusion layer which are in this order connected with each other. A second conductivity type high impurity concentration semiconductor layer is formed in contact with a top of the low impurity concentration region. A bottom electrode is formed within the insulation layer so that the bottom electrode is surrounded by the insulation layer. The bottom electrode is positioned under the low impurity concentration region and being separated by the insulation layer from the low impurity concentration region. It is important that the bottom electrode does not extend under the first conductivity high impurity concentration regions.

3 Claims, 25 Drawing Sheets

BODY DRIVEN SOI-MOS FIELD EFFECT TRANSISTOR AND METHOD OF FORMING THE SAME

CROSS-REFERENCE TO RELATED APPLICATIONS

This application is a division of application Ser. No. 08/883,442, filed Jun. 26, 1997 now U.S. Pat. No. 6,049,110.

BACKGROUND OF THE INVENTION

The present invention relates to a transistor and a method of fabricating the same, and more particularly to a transistor to be used in high integration and low power LSI on an SOI substrate.

A conventional and typical body driven SOI-MOS field effect transistor will be described with reference to FIG. 1 which is a fragmentary cross sectional elevation view illustrative of the conventional and typical body driven SOI-MOS field effect transistor. A buried oxide film 102 is formed over a silicon substrate 101. An SOI layer 103 is formed over the buried oxide film 102. A gate oxide film 104 is formed on the SOI layer 103. A gate electrode 106 is formed on the gate oxide film 104. The SOI layer 103 comprises source/drain regions 105 sandwiching a body region 108 which is positioned under the gate oxide film 104. The body region 108 is introduced with a second conductivity type impurity at $1 \times 10^{17}$ cm$^{-3}$ through $1 \times 10^{18}$ cm$^{-3}$. If the gate voltage is applied to the gate, the body region 108 is divided into a neutral region 107 and a depletion region 109. A channel is formed on a top interface of the body region 108 in contact with the gate oxide film 104. A gate-channel capacitance Ccb and a channel-substrate capacitance exist.

Another SOI-MOS field effect transistor was reported by F. Assaderaghi et al. in IEDM 94, Technical Digest, p. 809. This conventional transistor has a structure as illustrated in FIG. 2 wherein an input signal is inputted into not only the gate but also the SOI layer by connecting the gate and the SOI layer by an interconnection H for high speed operations under low voltage.

The conventional SOI-MOS field effect transistor has the following two issues to be solved.

The first issue is concerned with the short channel effects of the SOI-MOS field effect transistors.

At first, relationships of the short channel effects to the thickness of the gate oxide film will be described. As the field effect transistor is scaled down and a channel length is shortened, the short channel effects deteriorate the performances of the transistor because the threshold voltage is dropped or the abruptness of the subthreshold is deteriorated due to influence of two dimensional electric fields from the source/drain regions.

In order to solve this problem, it was proposed to reduce the thickness of the gate oxide film for increasing a gate-channel capacitance Ccg with a coupling capacitance between the gate and channel. As a result, the controllability to the channel by the gate electrode is increased to thereby suppress the short channel effects.

The reduction in thickness of the gate oxide film raises the problems with difficulty in forming an extremely thin gate oxide film and in addition another difficulty in securing the quality of the gate oxide film in view of insulation performance and reliability over time.

In order to scale down the transistor, it is required to increase the gate-channel capacitance without reduction in thickness of the gate oxide film.

Subsequently, dependency of the short channel effects upon the impurity concentration will be described.

In order to suppress the short channel effects, it was proposed to increase the impurity concentration of the substrate. As illustrated in FIG. 3, if the impurity concentration is increased, the width of the depletion region 109 is made narrow and the neutral region 107 approaches the source/drain regions 105. For those reasons, the electric field from the source/drain regions increases in component to be terminated by the neutral region 107 whereby the deterioration in performance of the transistor due to the two-dimensional electric field from the source/drain regions 105 can be suppressed.

On the other hand, the threshold voltage of the transistor also depends upon the impurity concentration of the substrate. As illustrated in FIG. 3, if the impurity concentration of the substrate is increased, then the threshold voltage is varied. The setting of the threshold voltage and the suppression of the short channel effects are harmfully dependent upon and influenced by each other. It is difficult for the conventional transistor to control the impurity concentration of the substrate and the threshold voltage independently.

The controllability YC to the channel is high when the gate-channel capacitance Ccg is large whilst the channel-substrate capacitance Ccb is small. With reference back to FIG. 1, the channel potential is decided by a potential division by two capacitances connected in series, for example, the gate-channel capacitance Ccg and the channel-substrate capacitance Ccb. If a ratio of the gate-channel capacitance Ccg to the channel-substrate capacitance Ccb is increased, then a difference between the channel potential and the gate potential is decreased, whereby a responsibility of the channel potential to the gate potential is improved and thus the controllability to the channel by the gate is improved.

In the normal and conventional field effect transistors, if the impurity concentration of the substrate is increased for suppressing the short channel effects, then the gate-channel capacitance Ccg remains unchanged but the channel-substrate capacitance Ccb is increased whereby controllability to the channel by the gate is deteriorated and also S-factor is deteriorated. S-factor means a variation in gate voltage necessary for changing the subthreshold voltage by one order.

In view of the scaling down the transistor, it is required to increase the impurity concentration of the substrate without providing any influence to the threshold voltage and the channel-substrate capacitance.

The above description may be applied to the transistor illustrated in FIG. 2.

The subsequent descriptions will focus on the second issue concerning the substrate floating effect of the SOI-MOSFET. The insulation layer separates the substrate and the SOI semiconductor layer of a first conductivity type in the SOI structure, for which reason second conductivity type carriers are prevented by the buried oxide film from flowing between the substrate and the SOI semiconductor layer. Since the body driven SOIMOSFET is operated by a low voltage, if bias conditions are changed, the neutral region varies in width thereby causing excess carriers or holes or resulting in lack of holes. Notwithstanding, the excess carriers are prevented by the buried oxide film from exhaustion to the substrate or supply of holes to the SOI layer. This may cause transient abnormal operations of the transistor. Further, incidence of alpharay in the channel direction causes atomic ionization of the semiconductor thereby generating the second conductivity type carrier in the SOI layer. Notwithstanding, the second conductivity type carrier is prevented by the buried oxide layer from exhaustion to the substrate.

For the stable operations of the transistor, a structure allowing supply and exhaustion of holes is needed.

In the above circumstances, it has been required to develop a novel body driven SOI-MOS field effect transistors free from the above problems.

SUMMARY OF THE INVENTION

Accordingly, it is an object of the present invention to provide a novel body driven SOI-MOS field effect transistor free from the above problems and disadvantages.

It is a further object of the present invention to provide a novel body driven SOI-MOS field effect transistor having a small parasitic capacitance.

It is a still further object of the present invention to provide a novel body driven SOI-MOS field effect transistor free from the substrate bias effects.

It is yet a further object of the present invention to provide a novel body driven SOI-MOS field effect transistor free from the substrate floating effects.

It is a further object of the present invention to provide a novel body driven SOI-MOS field effect transistor free from the short channel effects.

It is moreover an object of the present invention to provide a novel body driven SOI-MOS field effect transistor operable by a low voltage.

It is another object of the present invention to provide a method of fabricating a novel body driven SOI-MOS field effect transistor free from the above problems and disadvantages.

It is further another object of the present invention to provide a method of fabricating a novel body driven SOI-MOS field effect transistor having a small parasitic capacitance.

It is still more an object of the present invention to provide a method of fabricating a novel body driven SOI-MOS field effect transistor free from the substrate bias effects.

It is still another object of the present invention to provide a method of fabricating a novel body driven SOI-MOS field effect transistor free from the substrate floating effects.

It is yet another object of the present invention to provide a method of fabricating a novel body driven SOI-MOS field effect transistor free from the short channel effects.

It is an additional object of the present invention to provide a method of fabricating a novel body driven SOI-MOS field effect transistor operable by a low voltage.

The above and other objects of the present invention will be apparent from the following descriptions.

The present invention provides a semiconductor device comprising the following elements. An insulation layer extends on at least a top surface of a bottom electrode region. A first semiconductor region of a first conductivity type is formed over a first area of the insulation layer. The first semiconductor region has a first impurity concentration. A second semiconductor region is formed over a second area of the insulation layer. One side of the second semiconductor region is in contact directly with the first semiconductor region. The second semiconductor region has a second impurity concentration which is lower than the first impurity concentration. A third semiconductor region of the first conductivity type is formed over a third area of the insulation layer. The third semiconductor region is in contact directly with an opposite side of the second semiconductor region. The third semiconductor region has a third impurity concentration which is higher than the second impurity concentration. A top electrode region is formed in contact directly with a top surface of the second semiconductor region. The top electrode region being applied with a voltage signal. The bottom electrode region is applied with a bottom gate voltage of an opposite polarity to the first conductivity type. It is important that $\epsilon 1/d1 > \epsilon 2/d2$, where $\epsilon 1$ is a first dielectric constant of the second semiconductor region, $d1$ is a distance between a top of an depletion layer and a highest carrier concentration portion of a channel layer, $\epsilon 2$ is a second dielectric constant of the insulation layer, and $d2$ is a thickness of the insulation layer.

The present invention provides a semiconductor device comprising the following elements. An insulation layer extends on at least a top surface of the bottom electrode region. A first semiconductor region of a first conductivity type is formed over a first area of the insulation layer. The first semiconductor region has a first impurity concentration. A second semiconductor region is formed over a second area of the insulation layer. One side of the second semiconductor region is in contact directly with the first semiconductor region. The second semiconductor region has a second impurity concentration which is lower than the first impurity concentration. A third semiconductor region of the first conductivity type is formed over a third area of the insulation layer. The third semiconductor region is in contact directly with an opposite side of the second semiconductor region. The third semiconductor region has a third impurity concentration which is higher than the second impurity concentration. A top electrode region is formed in contact directly with a top surface of the second semiconductor region, the top electrode region being applied with a voltage signal. The bottom electrode region is applied with a bottom gate voltage of an opposite polarity to the first conductivity type. It is important that $Ccg > Ccb$, where $Ccg$ is a first capacitance between the top electrode and a highest impurity concentration portion of an inversion region caused in the second semiconductor region, and $Ccb$ is a first capacitance between the top electrode and the highest carrier concentration portion of the inversion region.

The present invention also provides a semiconductor device comprising the following elements. A semiconductor layer extends over the insulator and comprises a first conductivity type high impurity concentration diffusion layer, a low impurity concentration region and another first conductivity type high impurity concentration diffusion layer which are in this order connected with each other. A second conductivity type high impurity concentration semiconductor layer is formed in contact with a top of the low impurity concentration region. A bottom electrode is formed under the insulation layer.

The present invention provides a semiconductor device comprising the following elements. A semiconductor layer extends over the insulator and comprises a first conductivity type high impurity concentration diffusion layer, a low impurity concentration region and another first conductivity type high impurity concentration diffusion layer which are in this order connected with each other. A second conductivity type high impurity concentration semiconductor layer is formed in contact with a top of the low impurity concentration region. A bottom electrode is formed within the insulation layer so that the bottom electrode is surrounded by the insulation layer. The bottom electrode is positioned under the low impurity concentration region and being separated by the insulation layer from the low impurity concentration region. The bottom electrode has a width which is equal to or nearly equal to a width of the low impurity concentration region so that edges of the bottom electrode are positioned to just or almost correspond in plane view to edges of the low impurity concentration region.

The present invention provides a semiconductor device comprising the following elements. A semiconductor layer extends over the insulator and comprises a first conductivity type high impurity concentration diffusion layer, a low impurity concentration region and another first conductivity type high impurity concentration diffusion layer which are in this order connected with each other. A second conductivity type high impurity concentration semiconductor layer is formed in contact with a top of the low impurity concentration region. A bottom electrode is formed within the insulation layer so that the bottom electrode is surrounded by the insulation layer. The bottom electrode is positioned under the low impurity concentration region and being separated by the insulation layer from the low impurity concentration region. It is important that the bottom electrode does not extend under the first conductivity high impurity concentration regions.

The present invention also provides a semiconductor device comprising an insulator at least a part of which comprises a ferroelectric layer, a monocrystal semiconductor formed over the insulator, and a conductive electrode formed under the insulator.

The present invention also provides a method of fabricating a semiconductor device comprising the following steps. A mask pattern is provided on a first region of a semiconductor layer over an insulation layer. The semiconductor layer is selectively etched by use of the mask pattern to reduce a thickness of a second region of the semiconductor layer to other than that of the first region. A second conductivity type impurity containing layer is provided on the second region of the semiconductor layer. A first conductivity impurity containing layer is provided on the second region of the semiconductor layer. Terminals are provided on the first and second conductivity type impurity containing layers.

The present invention provides a method of fabricating a semiconductor device comprising the following steps. A dummy pattern is provided on a first part of an insulator. A first conductivity type high impurity concentration diffusion layer is provided on a second part other than the first part covered by the dummy pattern. An insulation film which covers the dummy pattern is deposited. An opening is provided in the insulation film over the dummy pattern in order to remove the dummy pattern by etching through the opening and thereby forming a slit. A semiconductor containing an impurity is formed in the slit.

The present invention also provides a method of fabricating a semiconductor device comprising the following steps. A dummy pattern is formed on a first part of an insulator. A first conductivity type high impurity concentration diffusion layer is provided on a second part other than the first part covered by the dummy pattern. An insulation film is deposited which covers the dummy pattern. An opening is formed in the insulation film over the dummy pattern in order to remove the dummy pattern by etching through the opening and thereby forming a slit before providing a metal in the slit.

The present invention provides a method of fabricating a semiconductor device comprising the following steps. An insulator is provided over a semiconductor substrate. A semiconductor layer is provided over the insulator. A convex portion is provided on the semiconductor layer. An ion-implantation is carried out to have ions achieve a region of the semiconductor substrate under the convex portion.

BRIEF DESCRIPTIONS OF THE DRAWINGS

Preferred embodiments of the present invention will be described in detail with reference to the accompanying drawings.

DISCLOSURE OF THE INVENTION

Figure 1:
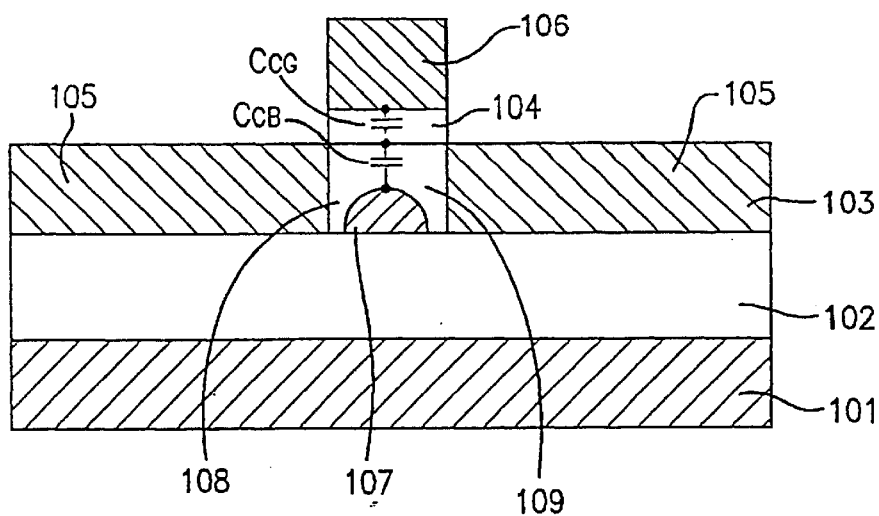
FIG. 1 is a fragmentary cross sectional elevation view illustrative of the conventional and typical body driven SOI-MOS field effect transistor.
Figure 2:
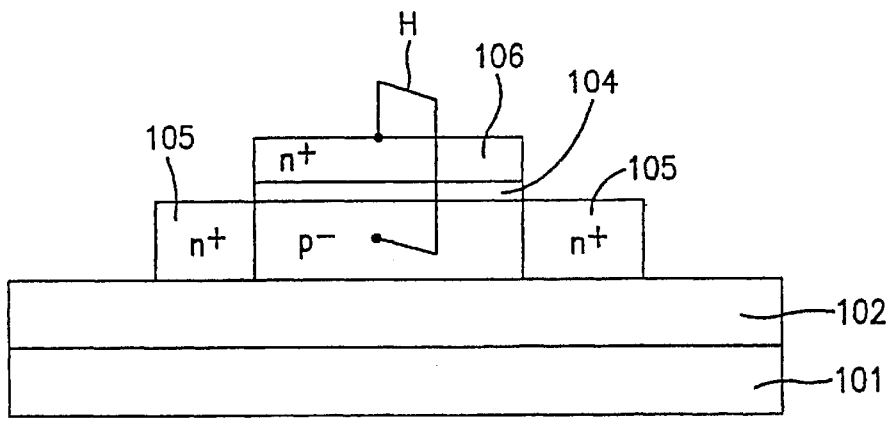
FIG. 2 is a fragmentary cross sectional elevation view illustrative of the other conventional and typical body driven SOI-MOS field effect transistor.
Figure 3:
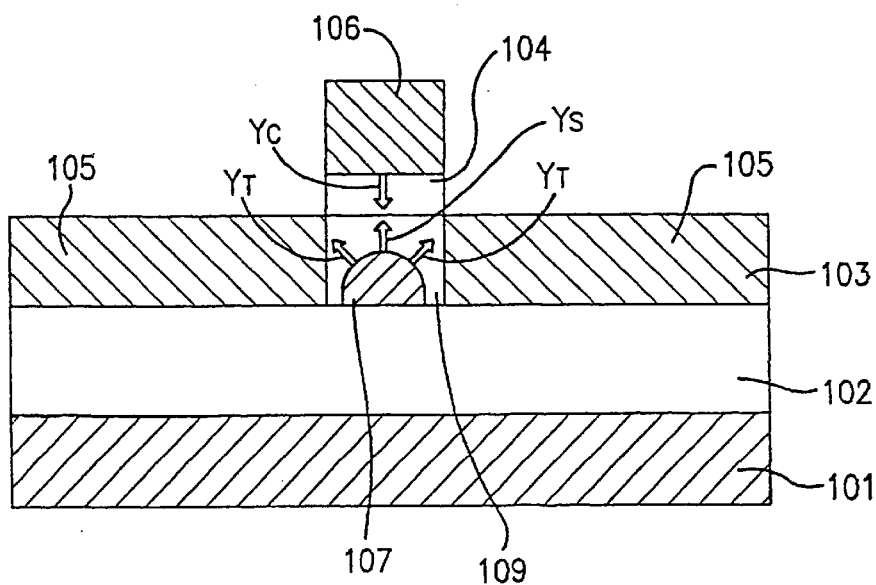
FIG. 3 is a fragmentary cross sectional elevation view illustrative of the conventional and typical body driven SOI-MOS field effect transistor.

The present invention provides a semiconductor device comprising the following elements. An insulation layer extends on at least a top surface of a bottom electrode region. A first semiconductor region of a first conductivity type is formed over a first area of the insulation layer. The first semiconductor region has a first impurity concentration. A second semiconductor region is formed over a second area of the insulation layer. One side of the second semiconductor region is in contact directly with the first semiconductor region. The second semiconductor region has a second impurity concentration which is lower than the first impurity concentration. A third semiconductor region of the first conductivity type is formed over a third area of the insulation layer. The third semiconductor region is in contact directly with an opposite side of the second semiconductor region. The third semiconductor region has a third impurity concentration which is higher than the second impurity concentration. A top electrode region is formed in contact directly with a top surface of the second semiconductor region. The top electrode region being applied with a voltage signal. The bottom electrode region is applied with a bottom gate voltage of an opposite polarity to the first conductivity type. It is important that $\epsilon 1/d1 > \epsilon 2/d2$, where $\epsilon 1$ is a first dielectric constant of the second semiconductor region, d1 is a distance between a top of an depletion layer and a highest carrier concentration portion of a channel layer, $\epsilon 2$ is a second dielectric constant of the insulation layer, and d2 is a thickness of the insulation layer.

The bottom gate voltage to be applied to the bottom electrode is a fixed bias voltage or a bias voltage which slowly varies in a long time duration so that the voltage level may considered to remains substantially unchanged in view of the device operation.

In the conventional and normal MOSFET, an input side capacitance Ccg corresponds to the capacitance of a gate oxide film whilst a channel-substrate capacitance Ccb corresponds to the capacitance of the depletion region to be caused in the semiconductor layer. Both the input side capacitance Ccg and the channel-substrate capacitance Ccb satisfy the equation of Ccg>Ccb. Also in the transistor of the above present invention, if the input side capacitance Ccg is larger than the channel-substrate capacitance Ccb, then the above novel transistor is compatible with the normal MOSFET in current value and in threshold voltage. If the depletion layer occupies entirely the low impurity concentration region (the second semiconductor region), then the input side capacitance Ccg corresponds a capacitance between the bottom of the top electrode in contact directly with the low impurity concentration region (the second semiconductor region) and the channel, or the highest carrier concentration portion of an inversion layer to be caused. If the depletion layer does not occupy the entire low impurity concentration region (the second semiconductor region) and a neutral region remains at upper portion of the low impurity concentration region (the second semiconductor region), then the input side capacitance Ccg corresponds a capacitance between the bottom of the neutral region in the low impurity concentration region (the second semiconductor region) and the channel. The capacitance Ccb corresponds a capacitance between the channel and the bottom electrode.

Each of the above capacitances Ccg or Ccb, is a two-dimensional capacitance. The structure of the transistor may be determined by approximately estimating capacitance Ccg or Ccb on the basis of the standard as described below. In accordance with the one-dimensional approximation, the capacitance Ccg is given as a capacitance per a unit area by $\epsilon 0 \epsilon 1/d1$, where $\epsilon 0$ is the dielectric constant in vacuum, $\epsilon 1$ is the dielectric constant of a semiconductor of the low impurity concentration region (the second semiconductor region), and d1 is the distance between the top electrode and the channel if no neutral region exits in the low impurity concentration region (the second semiconductor region) or the distance between the neutral region and the channel if the neutral region exits in the low impurity concentration region (the second semiconductor region). The channel extends upwardly from the bottom interface of the low impurity concentration region. Carrier concentration of the channel has the highest value on the bottom interface of the low impurity concentration region or in the vicinity of the bottom interface. The position of the channel may be represented by or may be considered to be the position of the bottom interface of the low impurity concentration region. In this case, if the depletion layer occupies the entire of the low impurity concentration region whilst no neutral region exits in the low impurity concentration region, then the distance d1 corresponds to a distance between the bottom of the top electrode in contact directly with the low impurity concentration region and the bottom interface of the low impurity concentration region. If, however, the depletion layer does not occupy the entire low impurity concentration region and a neutral region partially exits in an upper region of the low impurity concentration region, then the distance d1 corresponds to a distance between the bottom of the neutral region and the bottom interface of the low impurity concentration region. The distance d1 may alternatively be considered to be a thickness of the depletion layer in the low impurity concentration region regardless of presence or absence of the neutral region in the low impurity concentration region. If the depletion layer occupies the entire of the low impurity concentration region whilst no neutral region exits in the low impurity concentration region, then d1 corresponds to the thickness of the low impurity concentration region (the second semiconductor region).

On the other hand, in accordance with the one-dimensional approximation, the capacitance Ccb is given as a capacitance per a unit area by $\epsilon 0 \epsilon 2/d2$, where $\epsilon 0$ is the dielectric constant in vacuum, $\epsilon 2$ is the dielectric constant of the insulation layer, and d1 is the thickness of the insulation layer.

Accordingly, if $\epsilon 1/d1 > \epsilon 2/d2$ is satisfied, then $Ccg > Ccb$ is satisfied.

Here, if d1' is defined to be a thickness of the low impurity concentration region (the second semiconductor region), then d1' is not less than d1. Thus, if $\epsilon 1/d1' > \epsilon 2/d2$ is satisfied, then $\epsilon 1/d1 > \epsilon 2/d2$ is satisfied and, therefore, $Ccg > Ccb$ is also satisfied. Accordingly, if $\epsilon 1/d1' > \epsilon 2/d2$ is satisfied, then $Ccg > Ccb$ is satisfied.

Assuming that the low impurity concentration region comprises silicon having a dielectric constant of 11.9 as $\epsilon 1$ and the insulation layer comprises silicon dioxide having a dielectric constant of 3.7 as $\epsilon 2$, if the thickness of the low impurity concentration region is not more than 3.2 times of the thickness of the insulation layer, then $\epsilon 1/d1 > \epsilon 2/d2$ is satisfied and thus $Ccg > Ccb$ is also satisfied.

It is preferable that the bottom electrode region comprises an impurity-doped semiconductor layer.

It is also preferable that the bottom electrode region comprises an impurity-doped semiconductor substrate.

It is also preferable that the bottom electrode region comprises a metal layer.

It is also preferable that the bottom electrode region comprises a metal silicide layer.

It is also preferable that the bottom electrode region comprises an alloy layer.

It is also preferable that the bottom electrode region comprises a conductive material.

It is also preferable that the top electrode region comprises a second conductivity type semiconductor which has a fourth impurity concentration being higher than the second impurity concentration of the second semiconductor region. In this case, it is further preferable that a part of the top electrode region comprises a conductive material which is higher in conductivity than and is different in material from the second conductivity type semiconductor. It is further more preferable that the conductive material comprises a metal, an alloy, a metal silicide or a semiconductor.

It is also preferable that the conductive material extends over a top surface of the second conductivity type semiconductor.

It is also preferable that the conductive material extends not only over a top surface but also on side walls of the second conductivity type semiconductor.

It is also preferable that the second conductivity type semiconductor has a wider band gap than those of the first, second and third semiconductor regions.

It is also preferable that the top electrode region comprises a metal.

It is also preferable that the top electrode region comprises an alloy.

It is also preferable that the top electrode region comprises a metal silicide.

It is also preferable that the second semiconductor region is of the first conductivity type.

It is also preferable that the second semiconductor region is of a second conductivity type.

It is also preferable that the second semiconductor region comprises an intrinsic semiconductor.

It is also preferable that the second semiconductor region has a top surface level which is equal to the first and third semiconductor regions.

It is also preferable that the second semiconductor region has a top surface level which is higher than the first and third semiconductor regions.

It is also preferable to further provide an insulation film extending over the first and third semiconductor regions and the insulation film being in contact directly with side walls of a higher level portion of the second semiconductor region than the first and third semiconductor regions.

It is also preferable that the first conductivity type is n-type and the second semiconductor region comprises a bottom layer being in contact directly with the insulation layer and having a first conduction band edge, and a top layer of the same conductivity type as the bottom layer. The top layer extends over the bottom layer and being in contact directly with the top electrode region. The top layer has a second conduction band edge which lies in vacuum at a higher level than that of the first conduction band edge.

It is also preferable that the first conductivity type is p-type and the second semiconductor region comprises a bottom layer being in contact directly with the insulation layer and having a first valence band edge, and a top layer of the same conductivity type as the bottom layer. The top layer extends over the bottom layer and being in contact directly with the top electrode region. The top layer has a second valence band edge which lies in vacuum at a lower level than that of the first valence band edge.

It is preferable that at least a part of the second semiconductor region comprises a narrow band gap region.

It is also preferable that at least a part of the second semiconductor region comprises an Si—Ge amorphous region.

It is also preferable that at least a part of the second semiconductor region comprises a Ge region.

It is also preferable that the second semiconductor region comprises a bottom layer comprising an intrinsic semiconductor and being in contact directly with the insulation layer, and a top layer of a second conductivity type extending over the bottom layer and being in contact directly with the top electrode region.

It is also preferable that the second semiconductor region comprises a bottom layer comprising an intrinsic semiconductor and being in contact directly with the insulation layer, and a top layer of the first conductivity type extending over the bottom layer and being in contact directly with the top electrode region.

It is also preferable that the insulation layer has a region having charges of an opposite polarity to the first conductivity type and extending at least under the second semiconductor region.

It is also preferable that the bottom gate voltage is of an opposite polarity to the first conductivity type.

It is also preferable that the bottom gate voltage is zero.

It is also preferable that the insulation layer includes a ferroelectric layer being so polarized that a top interface of the ferroelectric layer has an opposite polarity to the first conductivity type and a bottom interface of the ferroelectric layer has the same polarity as the first conductivity type. In this case, it is further preferable that the bottom gate voltage is of an opposite polarity to the first conductivity type. It is also preferable that the bottom gate voltage is zero.

It is also preferable that the insulation layer extends over the top surface of the bottom electrode region. In this case, it is also preferable to further provide a floating gate electrode being positioned between the second semiconductor region and the bottom electrode region. The floating gate electrode is surrounded by the insulation layer and separated from the bottom electrode region and the second semiconductor region by the insulation layer.

It is also preferable that the insulation layer extends on entire surfaces of the bottom electrode region so that the bottom electrode region is surrounded by the insulation layer.

It is also preferable to further provide a floating gate electrode being positioned between the second semiconductor region and the bottom electrode region. The floating gate electrode is surrounded by the insulation layer and separated from the bottom electrode region and the second semiconductor region by the insulation layer.

It is also preferable that the top electrode region is vertically and horizontally off-set from the first and third semiconductor regions, and wherein the insulation layer extends on entire surfaces of the bottom electrode region so that the bottom electrode region is surrounded by the insulation layer.

It is also preferable that the second semiconductor region is of the first conductivity type and the first conductivity type is n-type provided that the bottom gate voltage is of an opposite polarity to the first conductivity type.

It is also preferable that the second semiconductor region is of the first conductivity type and the first conductivity type is n-type provided that the bottom gate voltage is zero.

The present invention provides a semiconductor device comprising the following, elements. A first semiconductor region of a first conductivity type is formed over a first area of the insulation layer and having a first impurity concentration. A second semiconductor region is formed over a second area of the insulation layer. One side of the second semiconductor region is in contact directly with the first semiconductor region. The second semiconductor region has a second impurity concentration which is lower than the first impurity concentration. A third semiconductor region of the first conductivity type is formed over a third area of the insulation layer. The third semiconductor region is in contact directly with an opposite side of the second semiconductor region. The third semiconductor region has a third impurity concentration which is higher than the second impurity concentration. A top electrode region is formed in contact directly with a top surface of the second semiconductor region. The top electrode region is applied with a voltage signal. It is important that the insulation layer has a region having charges of an opposite polarity to the first conductivity type and extending at least under the second semiconductor region.

It is preferable that the top electrode region comprises a second conductivity type semiconductor which has a fourth impurity concentration being higher than the second impurity concentration of the second semiconductor region.

It is also preferable that a part of the top electrode region comprises a conductive material which is higher in conductivity than and is different in material from the second conductivity type semiconductor. In this case, it is also preferable that the conductive material comprises a metal. It is also preferable that the conductive material comprises an alloy. It is also preferable that the conductive material comprises a metal silicide. It is also preferable that the conductive material comprises a semiconductor. It is also preferable that the conductive material extends over a top surface of the second conductivity type semiconductor. It is also preferable that the conductive material extends not only over a top surface but also on side walls of the second conductivity type semiconductor.

It is also preferable that the second conductivity type semiconductor has a wider band gap than those of the first, second and third semiconductor regions.

It is also preferable that the top electrode region comprises a metal.

It is also preferable that the top electrode region comprises an alloy.

It is also preferable that the top electrode region comprises a metal silicide.

It is also preferable that the second semiconductor region is of the first conductivity type.

It is also preferable that the second semiconductor region has a top surface level which is equal to the first and third semiconductor regions.

It is also preferable that the second semiconductor region has a top surface level which is higher than the first and third semiconductor regions.

It is also preferable to further provide an insulation film extending over the first and third semiconductor regions and the insulation film being in contact directly with side walls of a higher level portion of the second semiconductor region than the first and third semiconductor regions.

It is also preferable that the first conductivity type is n-type and the second semiconductor region comprises a bottom layer being in contact directly with the insulation layer and having a first conduction band edge, and a top layer of the same conductivity type as the bottom layer. The top layer extends over the bottom layer and is in contact directly with the top electrode region. The top layer has a second conduction band edge which lies in vacuum at a higher level than that of the first conduction band edge.

It is also preferable that at least a part of the second semiconductor region comprises a narrow band gap region.

It is also preferable that at least a part of the second semiconductor region comprises an Si—Ge amorphous region.

It is also preferable that at least a part of the second semiconductor region comprises a Ge region.

It is also preferable that the second conductivity type charge region comprises a charge containing region.

It is also preferable that the second conductivity type charge region comprises a top interface of a ferroelectric layer included in the insulation layer provided that the ferroelectric layer is so polarized that the top interface has an opposite polarity to the first conductivity type and a bottom interface of the ferroelectric layer has the same polarity as the first conductivity type.

The present invention provides a semiconductor device comprising the following elements. An insulation layer extends on at least a top surface of the bottom electrode region. A first semiconductor region of a first conductivity type is formed over a first area of the insulation layer. The first semiconductor region has a first impurity concentration. A second semiconductor region is formed over a second area of the insulation layer. One side of the second semiconductor region is in contact directly with the first semiconductor region. The second semiconductor region has a second impurity concentration which is lower than the first impurity concentration. A third semiconductor region of the first conductivity type is formed over a third area of the insulation layer. The third semiconductor region is in contact directly with an opposite side of the second semiconductor region. The third semiconductor region has a third impurity concentration which is higher than the second impurity concentration. A top electrode region is formed in contact directly with a top surface of the second semiconductor region, the top electrode region being applied with a voltage signal. The bottom electrode region is applied with a bottom gate voltage of an opposite polarity to the first conductivity type. It is important that Ccg>Ccb, where Ccg is a first capacitance between the top electrode and a highest impurity concentration portion of an inversion region caused in the second semiconductor region, and Ccb is a first capacitance between the top electrode and the highest carrier concentration portion of the inversion region.

The bottom gate voltage to be applied to the bottom electrode is a fixed bias voltage or a bias voltage which slowly varies in a long time duration so that the voltage level may considered to remain substantially unchanged in view of the device operation.

In the conventional and normal MOSFET, an input side capacitance Ccg corresponds to the capacitance of a gate oxide film whilst a channel-substrate capacitance Ccb corresponds to the capacitance of the depletion region to be caused in the semiconductor layer. Both the input side capacitance Ccg and the channel-substrate capacitance Ccb satisfy the equation of Ccg>Ccb. Also in the transistor of the above present invention, if the input side capacitance Ccg is larger than the channel-substrate capacitance Ccb, then the above novel transistor is compatible with the normal MOSFET in current value and in threshold voltage. If the depletion layer occupies entirely the lows impurity concentration region (the second semiconductor region), then the input side capacitance Ccg corresponds a capacitance between the bottom of the top electrode in contact directly with the low impurity concentration region (the second semiconductor region) and the channel, or the highest carrier concentration portion of an inversion layer to be caused. If the depletion layer does not occupy the entire the low impurity concentration region (the second semiconductor region) and a neutral region remains at upper portion of the low impurity concentration region (the second semiconductor region), then the input side capacitance Ccg corresponds to a capacitance between the bottom of the neutral region in the low impurity concentration region (the second semiconductor region) and the channel. The capacitance Ccb corresponds a capacitance between the channel and the bottom electrode.

Each of the above capacitances, Ccg or Ccb, is two-dimensional capacitance. The structure of the transistor may be determined by approximately estimating capacitance Ccg or Ccb on the basis of the standard as described below. In accordance with the one-dimensional approximation, the capacitance Ccg is given as a capacitance per a unit area by $\epsilon 0 \epsilon 1/d1$, where $\epsilon 0$ is the dielectric constant in vacuum, $\epsilon 1$ is the dielectric constant of a semiconductor of the low impurity concentration region (the second semiconductor region), and d1 is the distance between the top electrode and the channel if no neutral region exits in the low impurity concentration region (the second semiconductor region) or the distance between the neutral region and the channel if the neutral region exits in the low impurity concentration region (the second semiconductor region). The channel extends upwardly from the bottom interface of the low impurity concentration region. Carrier concentration of the channel has the highest value on the bottom interface of the low impurity concentration region or in the vicinity of the bottom interface. The position of the channel may be represented by or may be considered to be the position of the bottom interface of the low impurity concentration region. In this case, if the depletion layer occupies the entire of the low impurity concentration region whilst no neutral region exits in the low impurity concentration region, then the distance d1 corresponds to a distance between the bottom of the top electrode in contact directly with the low impurity concentration region and the bottom interface of the low impurity concentration region. If, however, the depletion layer does not occupy entire low impurity concentration region and a neutral region partially exits in an upper region of the low impurity concentration region, then the distance d1 corresponds to a distance between the bottom of the neutral region and the bottom interface of the low impurity concentration region. The distance d1 may alternatively be considered to be a thickness of the depletion layer in the low impurity concentration region regardless of presence or absence of the neutral region in the low impurity concentration region. If the depletion layer occupies the entire of the low impurity concentration region Whilst no neutral region exits in the low impurity concentration region, then d1 corresponds to the thickness of the low impurity concentration region (the second semiconductor region).

On the other hand, in accordance with the one-dimensional approximation, the capacitance Ccb is given as a capacitance per a unit area by $\epsilon 0 \epsilon 2/d2$, where $\epsilon 0$ is the dielectric constant in vacuum, $\epsilon 2$ is the dielectric constant of the insulation layer, and d1 is the thickness of the insulation layer.

Accordingly, if $\epsilon 1/d1 > \epsilon 2/d2$ is satisfied, then Ccg>Ccb is satisfied.

Here, if d1' is defined to be a thickness of the low impurity concentration region (the second semiconductor region), then d1' is not less than d1. Thus, if $\epsilon 1/d1' > \epsilon 2/d2$ is satisfied, then $\epsilon 1/d1 > \epsilon 2/d2$ is satisfied and, therefore, Ccg>Ccb is also satisfied. Accordingly, if $\epsilon 1/d1' > \epsilon 2/d2$ is satisfied, then Ccg>Ccb is satisfied.

Assuming that the low impurity concentration region comprises silicon having a dielectric constant of 11.9 as $\epsilon 1$ and the insulation layer comprises silicon dioxide having a dielectric constant of 3.7 as $\epsilon 2$, if the thickness of the low impurity concentration region is not more than 3.2 times of the thickness of the insulation layer, then $\epsilon 1/d1 > \epsilon 2/d2$ is satisfied and thus Ccg>Ccb is also satisfied.

It is preferable that the bottom electrode region comprises an impurity-doped semiconductor layer.

It is also preferable that the bottom electrode region comprises an impurity-doped semiconductor substrate.

It is also preferable that the bottom electrode region comprises a metal layer.

It is also preferable that the bottom electrode region comprises a metal silicide layer.

It is also preferable that the bottom electrode region comprises an alloy layer.

It is also preferable that the bottom electrode region comprises a conductive material.

It is also preferable that the top electrode region comprises a second conductivity type semiconductor which has a fourth impurity concentration being higher than the second impurity concentration of the second semiconductor region. In this case, it is also preferable that a part of the top electrode region comprises a conductive material which is higher in conductivity than and is different in material from the second conductivity type semiconductor. It is also preferable that the conductive material comprises a metal. It is also preferable that the conductive material comprises an alloy. It is also preferable that the conductive material comprises a metal silicide. It is also preferable that the conductive material comprises a semiconductor. It is also preferable that the conductive material extends over a top surface of the second conductivity type semiconductor. It is also preferable that the conductive material extends not only over a top surface but also on side walls of the second conductivity type semiconductor.

It is also preferable that the second conductivity type semiconductor has a wider band gap than those of the first, second and third semiconductor regions.

It is also preferable that the top electrode region comprises a metal.

It is also preferable that the top electrode region comprises an alloy.

It is also preferable that the top electrode region comprises a metal silicide.

It is also preferable that the second semiconductor region is of the first conductivity type.

It is also preferable that the second semiconductor region is of a second conductivity type.

It is also preferable that the second semiconductor region comprises an intrinsic semiconductor.

It is also preferable that the second semiconductor region has a top surface level which is equal to the first and third semiconductor regions.

It is also preferable that the second semiconductor region has a top surface level which is higher than the first and third semiconductor regions. In this case, it is further preferable that further comprising an insulation film extending over the first and third semiconductor regions and the insulation film being in contact directly with side walls of a higher level portion of the second semiconductor region than the first and third semiconductor regions. It is also preferable that the first conductivity type is n-type and the second semiconductor region comprises a bottom layer being in contact directly with the insulation layer and comprising a semiconductor having a first conduction band edge, and a top layer of the same conductivity type as the bottom layer. The top layer extends over the bottom layer and being in contact directly with the top electrode region. The top layer comprises a semiconductor having a second conduction band edge which lies in vacuum at a higher level than that of the first conduction band edge.

It is also preferable that the first conductivity type is p-type and the second semiconductor region comprises a bottom layer being in contact directly with the insulation layer and comprising a semiconductor having a first valence band edge, and a top layer of the same conductivity type as the bottom layer. The top layer extends over the bottom layer and is in contact directly with the top electrode region. The top layer comprises a semiconductor having a second valence band edge which lies in vacuum at a lower level than that of the first valence band edge.

It is also preferable that at least a part of the second semiconductor region comprises a narrow band gap region.

It is also preferable that at least a part of the second semiconductor region comprises an Si—Ge amorphous region.

It is also preferable that at least a part of the second semiconductor region comprises a Ge region.

It is also preferable that the second semiconductor region comprises a bottom layer comprising an intrinsic semiconductor and being in contact directly with the insulation layer, and a top layer of a second conductivity type extending over the bottom layer and being in contact directly with the top electrode region.

It is also preferable that the second semiconductor region comprises a bottom layer comprising an intrinsic semiconductor and being in contact directly with the insulation layer, and a top layer of the first conductivity type extending over the bottom layer and being in contact directly with the top electrode region.

It is also preferable that the insulation layer has a region having charges of an opposite polarity to the first conductivity type and extending at least under the second semiconductor region. In this case, it is preferable that the bottom gate voltage is of an opposite polarity to the first conductivity type.

It is also preferable that the bottom gate voltage is zero.

It is also preferable that the insulation layer includes a ferroelectric layer extending under the second conductivity type ion containing region, the ferroelectric layer being so polarized that a top interface of the ferroelectric layer has an opposite polarity to the first conductivity type and a bottom interface of the ferroelectric layer has the same polarity as the first conductivity type.

It is also preferable that the bottom gate voltage is of an opposite polarity to the first conductivity type.

It is also preferable that the bottom gate voltage is zero.

It is also preferable that the insulation layer extends over the top surface of the bottom electrode region. In this case, it is preferable to further comprise a floating gate electrode being positioned between the second semiconductor region and the bottom electrode region. The floating gate electrode is surrounded by the insulation layer and separated from the bottom electrode region and the second semiconductor region by the insulation layer.

It is also preferable that the insulation layer extends on entire surfaces of the bottom electrode region so that the bottom electrode region is surrounded by the insulation layer.

It is also preferable to further provide a floating gate electrode being positioned between the second semiconductor region and the bottom electrode region. The floating gate electrode is surrounded by the insulation layer and separated from the bottom electrode region and the second semiconductor region by the insulation layer.

It is also preferable that the top electrode region is vertically and horizontally off-set from the first and third semiconductor regions, and the insulation layer extends on entire surfaces of the bottom electrode region so that the bottom electrode region is surrounded by the insulation layer.

It is also preferable that the second semiconductor region is of the first conductivity type and the first conductivity type is n-type provided that the bottom gate voltage is of an opposite polarity to the first conductivity type.

It is also preferable that the second semiconductor region is of the first conductivity type and the first conductivity type is n-type provided that the bottom gate voltage is zero.

The present invention also provides a semiconductor device comprising the following elements. A first semiconductor region of a first conductivity type is formed over a first area of the insulation layer. The first semiconductor region has a first impurity concentration. A second semiconductor region is formed over a second area of the insulation layer.

One side of the second semiconductor region is in contact directly with the first semiconductor region. The second semiconductor region has a second impurity concentration which is lower than the first impurity concentration.

A third semiconductor region of the first conductivity type is formed over a third area of the insulation layer. The third semiconductor region is in contact directly with an opposite side of the second semiconductor region.

The third semiconductor region has a third impurity concentration which is higher than the second impurity concentration. A top electrode region is formed in contact directly with a top surface of the second semiconductor region. The top electrode region is applied with a voltage signal. It is important that the insulation layer has a region having charges of an opposite polarity to the first conductivity type and extending at least under the second semiconductor region, and also important that Ccg>Ccb, where Ccg is a first capacitance between the top electrode and a highest impurity concentration portion of an inversion region caused in the second semiconductor region, and Ccb is a first capacitance as a coupling capacitance between a channel and the first and third semiconductor regions through the insulation layer.

It is preferable that the top electrode region comprises a second conductivity type semiconductor which has a fourth impurity concentration being higher than the second impurity concentration of the second semiconductor region.

It is preferable that a part of the top electrode region comprises a conductive material which is higher in conductivity than and is different in material from the second conductivity type semiconductor.

It is preferable that the conductive material comprises a metal.

It is also preferable that the conductive material comprises an alloy.

It is also preferable that the conductive material comprises a metal silicide.

It is also preferable that the conductive material comprises a semiconductor.

It is also preferable that the conductive material extends over a top surface of the second conductivity type semiconductor.

It is also preferable that the conductive material extends not only over a top surface but also on side walls of the second conductivity type semiconductor.

It is also preferable that the second conductivity type semiconductor has a wider band gap than those of the first, second and third semiconductor regions.

It is also preferable that the top electrode region comprises a metal.

It is also preferable that the top electrode region comprises an alloy.

It is also preferable that the top electrode region comprises a metal silicide.

It is also preferable that the second semiconductor region is of the first conductivity type.

It is also preferable that the second semiconductor region has a top surface level which is equal to the first and third semiconductor regions.

It is also preferable that the second semiconductor region has a top surface level which is higher than the first and third semiconductor regions.

It is also preferable to further provide an insulation film extending over the first and third semiconductor regions and the insulation film being in contact directly with side walls of a higher level portion of the second semiconductor region than the first and third semiconductor regions.

It is also preferable that the first conductivity type is n-type and the second semiconductor region comprises a bottom layer being in contact directly with the insulation layer and comprising a semiconductor having a first conduction band edge, and a top layer of the same conductivity type as the bottom layer. The top layer extends over the bottom layer and being in contact directly with the top electrode region. The top layer comprises a semiconductor having a second conduction band edge which lies at a higher level than that of the first conduction band edge.

It is also preferable that at least a part of the second semiconductor region comprises a narrow band gap region.

It is also preferable that at least a part of the second semiconductor region comprises an Si—Ge amorphous region.

It is also preferable that at least a part of the second semiconductor region comprises a Ge region.

It is also preferable that the second conductivity type charge region comprises a charge containing region.

It is also preferable that the second conductivity type charge region comprises a top interface of a ferroelectric layer included in the insulation layer provided that the ferroelectric layer is so polarized that the top interface has an opposite polarity to the first conductivity type and a bottom interface of the ferroelectric layer has the same polarity as the first conductivity type.

The present invention also provides a semiconductor device comprising the following elements. A semiconductor layer extends over the insulator and comprises a first conductivity type high impurity concentration diffusion layer, a low impurity concentration region and another first conductivity type high impurity concentration diffusion layer which are in this order connected with each other. A second conductivity type high impurity concentration semiconductor layer is formed in contact with a top of the low impurity concentration region. A bottom electrode is formed under the insulation layer.

It is also preferable that the low impurity concentration region comprises a region being doped with a first conductivity type impurity at a low concentration.

It is also preferable that the low impurity concentration region comprises a region being doped with a second conductivity type impurity at a low concentration.

It is also preferable that the low impurity concentration region comprises an intrinsic semiconductor.

It is also preferable that the bottom electrode comprises a conductive material.

It is also preferable that the conductive material is a metal.

It is also preferable that the conductive material is a metal silicide.

It is also preferable that the bottom electrode comprises a semiconductor.

It is also preferable that the low impurity concentration region is of the first conductivity type and an upper portion of the low impurity concentration region has a higher impurity concentration than a lower portion of the low impurity concentration region.

It is also preferable that a conductive electrode is buried in the insulation layer and a potential of the conductive electrode is varied to change a threshold voltage at which a channel is formed in the monocrystal semiconductor.

It is also preferable that at least a part of the bottom electrode at positions facing to the first conductivity type high impurity concentration regions has a larger distance from the semiconductor layer than that at positions facing to the low impurity concentration region.

The present invention provides a semiconductor device comprising the following elements. A semiconductor layer extends over the insulator and comprises a first conductivity type high impurity concentration diffusion layer, a low impurity concentration region and another first conductivity type high impurity concentration diffusion layer which are in this order connected with each other. A second conductivity type high impurity concentration semiconductor layer is formed in contact with a top of the low impurity concentration region. A bottom electrode is formed within the insulation layer so that the bottom electrode is surrounded by the insulation layer. The bottom electrode is positioned under the low impurity concentration region and being separated by the insulation layer from the low impurity concentration region. The bottom electrode has a width which is equal to or nearly equal to a width of the low impurity concentration region so that edges of the bottom electrode are positioned to just or almost correspond in plane view to edges of the low impurity concentration region.

The present invention provides a semiconductor device comprising the following elements. A semiconductor layer extends over the insulator and comprises a first conductivity type high impurity concentration diffusion layer, a low impurity concentration region and another first conductivity type high impurity concentration diffusion layer which are in this order connected with each other. A second conductivity type high impurity concentration semiconductor layer is formed in contact with a top of the low impurity concentration region. A bottom electrode is formed within the insulation layer so that the bottom electrode is surrounded by the insulation layer. The bottom electrode is positioned under the low impurity concentration region and being separated by the insulation layer from the low impurity concentration region. It is important that the bottom electrode does not extend under the first conductivity high impurity concentration regions.

The present invention also provides a semiconductor device comprising an insulator at least a part of which comprises a ferroelectric layer, a monocrystal semiconductor formed over the insulator, and a conductive electrode formed under the insulator.

It is also preferable that the insulator has a triple-layered structure of laminations of a normal insulator layer and a ferroelectric layer and another normal insulator layer.

It is also preferable that a potential of the conductive electrode is varied to change a polarization state of the ferroelectric whereby a threshold voltage at which a channel is formed in the monocrystal semiconductor is changed.

The present invention also provides a method of fabricating a semiconductor device comprising the following steps. A mask pattern is provided on a first region of a semiconductor layer over an insulation layer. The semiconductor layer is selectively etched by use of the mask pattern to reduce a thickness of a second region of the semiconductor layer other than the first region. A second conductivity type impurity containing layer is provided on the second region of the semiconductor layer. A first conductivity impurity containing layer is provided on the second region of the semiconductor layer. Terminals are provided on the first and second conductivity type impurity containing layers.

The present invention provides a method of fabricating a semiconductor device comprising the following steps. A dummy pattern is provided on a first part of an insulator. A first conductivity type high impurity concentration diffusion layer is provided on a second part other than the first part covered by the dummy pattern. An insulation film which covers the dummy pattern is deposited. An opening is provided in the insulation film over the dummy pattern in order to remove the dummy pattern by etching through the opening and thereby forming a slit. A semiconductor containing an impurity is formed in the slit.

The present invention also provides a method of fabricating a semiconductor device comprising the following steps. Dummy pattern is formed on a first part of an insulator. A first conductivity type high impurity concentration diffusion layer is provided on a second part other than the first part covered by the dummy pattern. An insulation film is deposited which covers the dummy pattern. An opening is formed in the insulation film over the dummy pattern in order to remove the dummy pattern by etching through the opening and thereby forming a slit before providing a metal in the slit.

The present invention provides a method of fabricating a semiconductor device comprising the following steps. An insulator is provided over a semiconductor substrate. A semiconductor layer is provided over the insulator. A convex portion is provided on the semiconductor layer. An ion-implantation is carried out to have ions achieve a region of the semiconductor substrate under the convex portion.

The operations of the novel transistor in accordance with the present invention will be described assuming that the transistor is an n-channel transistor. In case of a p-channel transistor, the following descriptions may be applicable by inverting the polarities.

The bottom gate is applied with a positive voltage to form an inversion layer at the bottom of the p-type region. A voltage to be applied to the bottom gate electrode is so set that the inversion layer is formed and disappeared at a threshold voltage (Vth) between a high voltage level (VH) and a low voltage level (VL). As a result, if the top gate electrode 6 is applied with a voltage higher than the threshold voltage, then an inversion layer is formed at a bottom region of the p-type region to thereby enter the transistor into conductive state. If, however, the top gate electrode is applied with a voltage lower than the threshold voltage, then an inversion layer is disappeared thereby entering into the non-conductive state. Accordingly, a switching operation or an amplifying operation can be made by varying an input signal applied to the top gate electrode between the high voltage level (VH) and the low voltage level (VL).

Differently from the normal and conventional MOS field effect transistors, in accordance with the present invention, the top gate electrode is in contact directly with the second conductivity region without intervening any gate oxide film. Even though no gate oxide film is formed, a gate channel capacitance Ccg is increased to improve the controllability to the channel by the top gate electrode.

In the normal and conventional MOSFET, in order to improve the controllability to the channel by the top gate electrode, it is required to reduce the thickness of the gate oxide film. In contrast, in accordance with the present invention, the top gate electrode is in contact through the depletion region to the channel. Namely, no oxide film having a low dielectric constant and a small static capacity exists between the top gate electrode and the channel. A capacitance between the neutral region and the channel in the novel transistor corresponds to the gate-channel capacitance of the normal and conventional MOSFET. Since only the semiconductor layer having a high dielectric constant is provided between the top gate and the channel, the gate-channel capacitance is high and the controllability to the channel by the top gate is also high. In order to increase the gate-channel capacitance, it is effective to increase the impurity concentration of the second conductivity type region under the top gate, or to reduce the thickness of the second conductivity type region. It is unnecessary to form a thin gate oxide film.

In accordance with the present invention, in order to suppress the short channel effects, an impurity concentration of the second conductivity type region adjacent to the top gate electrode is increased to increase a capacitance between a neutral region therein and the channel region. Therefore, although the impurity concentration of the substrate is increased to suppress the short channel effects, a gate-channel capacitance Ccg is increased to improve the controllability to the channel region.

Further, in accordance with the present invention, since the threshold voltage is controlled by the bottom gate electrode, the increase in impurity concentration of the substrate for suppression of the short channel effects can be made independently from setting the threshold voltage. The above novel transistor is free from the problem that in the normal field effect transistors setting the threshold voltage and suppressing the short channel effects are harmfully influenced to each other, for example, the problem with the increase in impurity concentration of the substrate for suppressing the short channel effects leads to an excessively high threshold voltage.

In accordance with the transistor of the present invention, the increase in impurity concentration of the second conductivity type low impurity concentration region in contact directly with the top gate electrode in order to suppress the short channel effects results in the increase in a capacitance between the neutral region and the channel.

The novel transistor in accordance with the present invention has the second conductivity type high impurity concentration region in contact directly with the top of the neutral region formed in an upper region of the p-type region. Otherwise, the second conductivity type high impurity concentration diffusion region has substantially the same roll as a neutral region in the SOI layer. For those reasons, injection and exhaustion of the second conductivity type carrier can readily be made through the second conductivity type high impurity concentration diffusion layer whereby no substrate floating effect results.

The low resistive metal or metal silicide is in contact with the top portion and sides of the top gate electrode so as to reduce a resistance of the top gate electrode in a direction along the channel width. The low resistive metal or metal silicide is in contact with not only the top portion but also the sides of the top gate electrode so as to reduce a semiconductor-metal contact resistance between the semiconductor 6 and the metal 10 which constitute the top gate electrode.

Of the top gate electrode, at least a part in contact with the low impurity concentration region comprises a metal to form the Schottky contact between the top gate electrode and the semiconductor region whereby a leak current flowing from the top gate electrode into the semiconductor layer can be reduced.

The charges are introduced into the insulation layer under the semiconductor region, the electric field from the charges plays substantially the same roll as the electric field from the bottom gate electrode applied with the voltage, for which reason it is possible to reduce the voltage to be applied to the bottom electrode or to apply no voltage to the bottom electrode. Otherwise, it is possible to omit the bottom gate electrode.

The ferroelectric layer is buried in the insulation layer and polarized charges are caused on the interface of the ferroelectric layer and the insulation layer. The electric field from the charges plays substantially the same roll as the electric field from the bottom gate electrode applied with the voltage, for which reason it is possible to reduce the voltage to be applied to the bottom electrode or to apply no voltage to the bottom electrode. Otherwise, it is possible to omit the bottom gate electrode.

The narrow band gap semiconductor is provided on the bottom region of the low impurity concentration region, for which reason it is possible to increase the carrier concentration in the channel region. Germanium as a narrow band gap semiconductor has a large hole-mobility, for which reason the n-channel transistor structure and the p-channel transistor may be used to form CMOS circuit for obtaining high speed circuit operations.

The floating gate is provided in the insulation layer between the bottom gate electrode and the low impurity concentration region wherein the floating gate is separated by the insulator from the bottom gate and the channel region. Charges are injected from the bottom gate electrode through the buried insulation film into the floating gate electrode or exhausted from the floating gate electrode through the buried insulation film to the bottom gate electrode. When the positive charge is injected into the floating gate electrode, substantially the same effects can be obtained as when the positive voltage is applied to the bottom gate electrode. When the positive charge is exhausted from the floating gate electrode or the negative charge is injected into the floating gate electrode, a threshold voltage of the transistor is increased. The threshold voltage of the circuit block in non-operational state in LSI circuits is increased in this manner to reduce a leak current which may flow in the transistor in OFF-state for reduction in power consumption of the transistor.

The threshold voltage of the transistor is varied by controlling the bottom gate voltage or the polarized charge for reducing the leak current in OFF-state resulting in reduction in power consumption.

The region in which the first conductivity type channel is formed comprises the second conductivity type semiconductor having a lower impurity concentration than the other second conductivity type region and than the second conductivity type high impurity concentration region acting as the top gate electrode, otherwise the above region comprises an intrinsic region so as to reduce the scattering by impurity in the channel region and allow an increase in current value and in addition reduce the parasitic capacitance between the second conductivity region and the source/drain regions.

The first and second conductivity type high impurity concentration regions are separated in horizontal or vertical direction to prevent band-to-band tunneling leak current. The top gate electrode is separated from the source/drain regions in horizontal or vertical direction to reduce a fringe capacitance as a parasitic capacitance between the top gate electrode and the source/drain regions thereby improving the high speed performances of the transistor.

The above present invention is applicable to silicon transistor or silicon device, for which reason the conventional LSI manufacturing apparatus and the conventional fabrication method are available.

The above novel transistor in accordance with the present invention may be used in place in the CMOS circuit or any other circuits having field effect transistors.

The structure of the above novel transistor may be modified to be inverted in the vertical direction or to be rotated in the vertical plane.

The low impurity concentration region extends outside the ends of the element region and the second conductivity type high impurity concentration region extends outside the ends of the low impurity concentration region, whereby it is prevented that in the OFF-state any inversion layer is formed at ends of the element region thereby causes leak currents. The inversion layer is hard to be formed in the second conductivity type high impurity concentration region, for which reason the second conductivity type high impurity concentration region extends the ends of the element region to prevent inversion layer from being formed at the ends of the element region under the OFF-condition.

The second conductivity type high impurity concentration extends outside the source/drain regions so as to suppress increases in a capacitance between the second conductivity type region and the source/drain regions and also suppress leak current by a band-to-band tunneling between the second conductivity type high impurity concentration region and the source/drain regions.

The mask pattern is formed over the SOI layer so as to be used as a mask for selectively etching the SOI layer. The first conductivity type impurity is diffused or implanted at high concentration into a thickness-reduced region of the SOI layer to form the first conductivity type high impurity concentration diffusion layers. On the other hand, the second conductivity type high impurity concentration diffusion layer is provided on the non-etched region of the SOI layer. Interconnections are formed to be connected to the first and second conductivity type high impurity layers wherein the interconnection connected to the second conductivity type high impurity concentration layer serves as an input terminal.

PREFERRED EMBODIMENTS

First Embodiment

Figure 4:
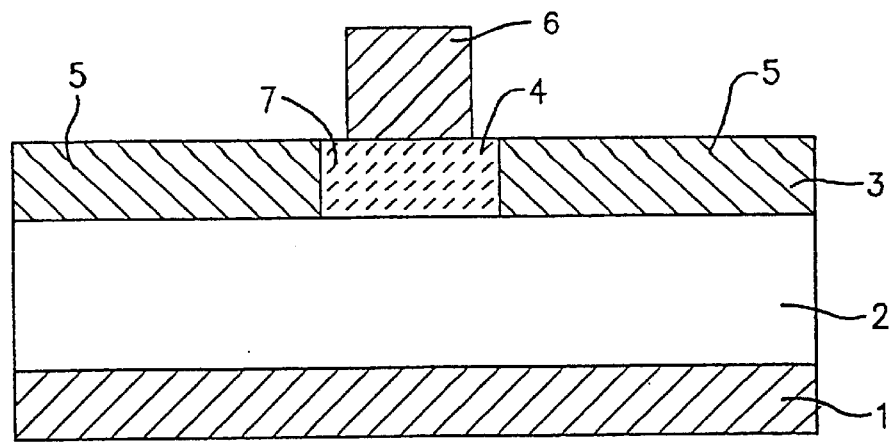
FIG. 4 is a fragmentary cross sectional elevation view illustrative of a novel body driven SOI-MOS field effect transistor in the first embodiment according to the present invention.
Figure 5:
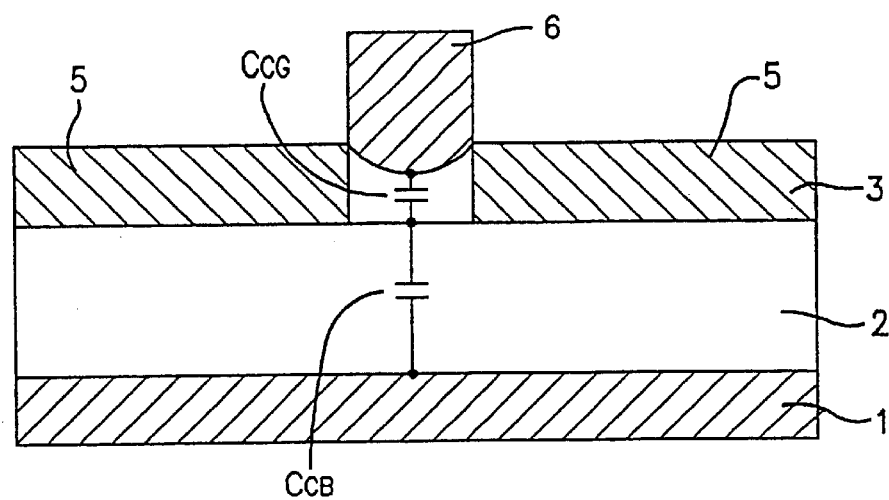
FIG. 5 is a fragmentary cross sectional elevation view illustrative of a relationship of a gate-channel capacitance Ccg to a channel-bottom gate capacitance Ccb for a novel body driven SOI-MOS field effect transistor in the first embodiment according to the present invention.
Figure 6:
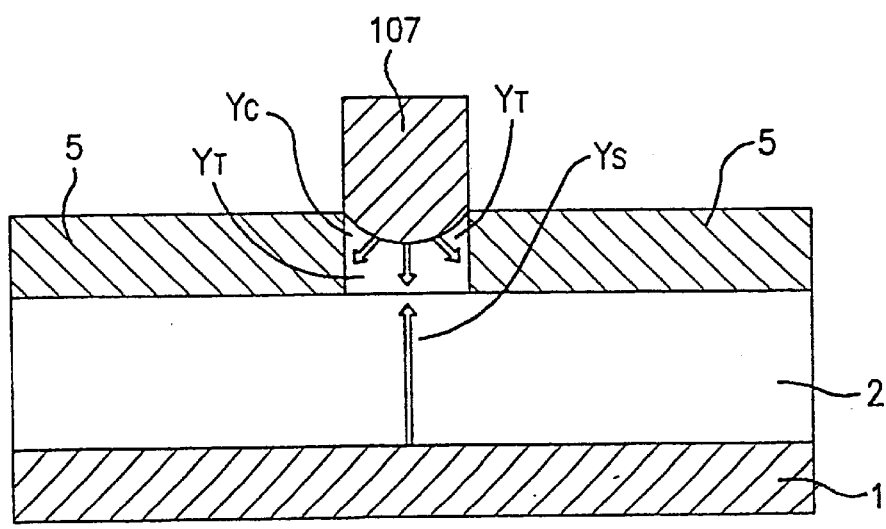
FIG. 6 is a fragmentary cross sectional elevation view illustrative of an independence of setting a threshold voltage from a suppression of the short channel effects for a novel body driven SOI-MOS field effect transistor in the first embodiment according to the present invention.

A first embodiment according to the present invention will be described in detail with reference to FIGS. 4, 5 and 6. FIG. 4 is a fragmentary cross sectional elevation view illustrative of a novel body driven SOI-MOS field effect transistor in the first embodiment according to the present invention. FIG. 5 is a fragmentary cross sectional elevation view illustrative of a relationship of a gate-channel capacitance Ccg to a channel-bottom gate capacitance Ccb for a novel body driven SOI-MOS field effect transistor in the first embodiment according to the present invention. FIG. 6 is a fragmentary cross sectional elevation view illustrative of an independence of setting a threshold voltage from a suppression of the short channel effects for a novel body driven SOI-MOS field effect transistor in the first embodiment according to the present invention.

As illustrated in FIG. 4, a semiconductor active layer 3 is provided which extends over a buried silicon oxide layer 2 as an insulation layer. The semiconductor active layer 3 includes a p-type low impurity concentration region 4 and source/drain diffusion regions 5 of a first conductivity type and having a high impurity concentration wherein the source/drain diffusion regions 5 sandwiches the p-type low impurity concentration region 4. A top gate electrode 6 comprising a second conductivity type high impurity concentration region is provided over and in contact directly with the p-type low impurity concentration region 4. A bottom gate electrode 1 is provided under the buried silicon oxide layer 2. The bottom gate electrode 1 may comprise one of conductive materials such as metals and metal silicides and semiconductors.

If the first conductivity type is n-type, then the bottom electrode is applied with a positive voltage and an input signal is applied to the top gate electrode so that output signals are obtained from one of the above first conductivity type high impurity concentration diffusion layers or from an element connected thereto. If, however, the first conductivity type is ptype, then the bottom electrode is applied with a negative voltage so that output signals are obtained from one of the above first conductivity type high impurity concentration diffusion layers or from an element connected thereto.

The above transistor may be fabricated as follows. Phosphorus is doped into a silicon substrate at $1 \times 10^{18}$ cm$^{-3}$ to form an n-type silicon substrate which serves as a bottom gate 1. A buried oxide layer 2 having a thickness of 100 nanometers is formed on the bottom gate 1. An SOI layer 3 comprising monocrystal silicon and having a thickness of 10 nanometers is provided on the buried oxide layer 2. In a center region of the SOI layer 3, a p-type region 4 is provided, which is doped with boron at an impurity concentration of $1 \times 10^{18}$ cm$^{-3}$ and having a width of 100 nanometers. At opposite sides of the p-type region 4, source/drain regions 5 are provided, which comprise n+-regions introduced with phosphorus at $1 \times 10^{20}$ cm$^{-3}$. A top gate electrode 6 comprising a p+-region and having a width of 80 nanometers and a height of 200 nanoemters is provided in contact with a center portion of a top surface of the p-type region 4.

The bottom gate 1 is applied with a positive voltage to form an inversion layer 7 at a bottom region of the p-type region 4. A voltage to be applied to the bottom gate electrode 6 is so set that the inversion layer is formed and disappeared at a threshold voltage (Vth) between a high voltage level (VH) and a low voltage level (VL). As a result, if the top gate electrode 6 is applied with a voltage higher than the threshold voltage, then an inversion layer is formed at a bottom region of the p-type region 4 to thereby enter the transistor into conductive state. If, however, the top gate electrode 6 is applied with a voltage lower than the threshold voltage, then an inversion layer is disappeared thereby entering into the non-conductive state. Accordingly, a switching operation or an amplifying operation can be made by varying an input signal applied to the top gate electrode between the high voltage level (VH) and the low voltage level (VL). The high voltage level, the low voltage level and the applied voltage to the bottom gate electrode may, for example, be 0.8V, 0.0V and 15V.

Differently from the normal and conventional MOS field effect transistors, in accordance with the present invention, the top gate electrode is in contact directly with the second conductivity region without intervening any gate oxide film. Even though no gate oxide film is formed, a gate channel capacitance Ccg is increased to improve the controllability of the channel by the top gate electrode.

In accordance with the present invention, in order to suppress the short channel effects, an impurity concentration of the second conductivity type region adjacent to the top gate electrode is increased to increase a capacitance between a neutral region therein and the channel region.

Therefore, although the impurity concentration of the substrate is increased to suppress the short channel effects, a gate-channel capacitance Ccg is increased to improve the controllability of the channel region.

Further, in accordance with the present invention, since the threshold voltage is controlled by the bottom gate electrode, the increase in impurity concentration of the substrate for suppression of the short channel effects can be made independently from setting the threshold voltage. The above novel transistor is free from the problem that in the normal field effect transistors setting the threshold voltage and suppressing the short channel effects are harmfully influenced to each other, for example, the problem with the increase in impurity concentration of the substrate for suppressing the short channel effects leads to an excessively high threshold voltage.

The second conductivity type high impurity concentration diffusion layer (the top gate electrode 6 comprising the p+-region) is in contact with the top of the neutral region formed in an upper region of the p-type region 4, or the second conductivity type high impurity concentration diffusion layer serves as a neutral region in the SOI layer. For those reasons, inflow or exhaustion of the second conductivity type carriers can be made through the second conductivity type high impurity concentration diffusion layer whereby no substrate floating effect appears.

The capacitance between the channel and the bottom gate electrode is independent from the impurity concentration. As illustrated in FIG. 5, the capacitance between the neutral region 107 and the channel corresponds to the gate-channel capacitance Ccg of the normal and conventional field effect transistors, whilst the capacitance between the channel and the bottom gate electrode corresponds to the channel-substrate capacitance Ccb. In accordance with the present invention, therefore, when the impurity concentration of the substrate is increased to suppress the short channel effects, then the gate-channel capacitance Ccg is increased whereby the controllability of the channel region by the gate electrode is improved differently from the normal and conventional field effect transistors.

Also, in accordance with the present invention, since the threshold voltage is controlled by the bottom gate electrode, it is possible to set a high impurity concentration of the substrate for suppressing the short channel effects and to set the threshold voltage independently from each other. Namely, a sufficiently high impurity concentration of the substrate is first set and then a potential of the bottom gate electrode is so set as to obtain the necessary threshold voltage. In case of the n-channel transistor, for example, in order to raise the threshold voltage, the potential of the bottom gate electrode is dropped. In order to drop the threshold voltage, the potential of the bottom gate electrode is increased. The problem that the setting of the threshold voltage and the suppression of the short channel effects are harmfully influenced by each other are thus solved. For example, the problem is solved is that the increase in impurity concentration of the substrate for suppression of the short channel effects results in an excessively high threshold voltage.

As illustrated in FIG. 6, in accordance with the present invention, there is no dependency between the setting of the threshold voltage (arrow YS) and the suppression of the short channel effects (arrow YT). Both are independently controllable. The arrow YT represents the control of the channel of the transistor.

Figure 7:
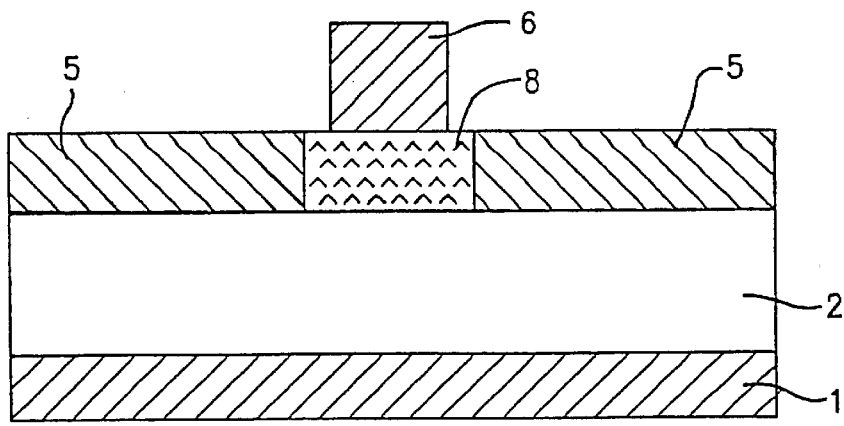
FIG. 7 is a fragmentary cross sectional elevation view illustrative of another novel body driven SOI-MOS field effect transistor as a modification to the first embodiment according to the present invention.

FIG. 7 is a fragmentary cross sectional elevation view illustrative of another novel body driven SOI-MOS field effect transistor as a modification to the first embodiment according to the present invention. The p-type region 4 in FIG. 4 is replaceable by an intrinsic region 8 in FIG. 7 as a modification to the first embodiment.

As a further modification, the p-type region 4 in FIG. 4 is replaceable by an n--region doped with phosphorus at $1\times10^{17}$ cm$^{-3}$. The bottom gate electrode may be made of a metal or a metal silicide.

As a further modification to the transistors of FIGS. 4 and 7, the bottom gate electrode may comprise a p-type silicon substrate introduced with boron.

Second Embodiment

Figure 8:
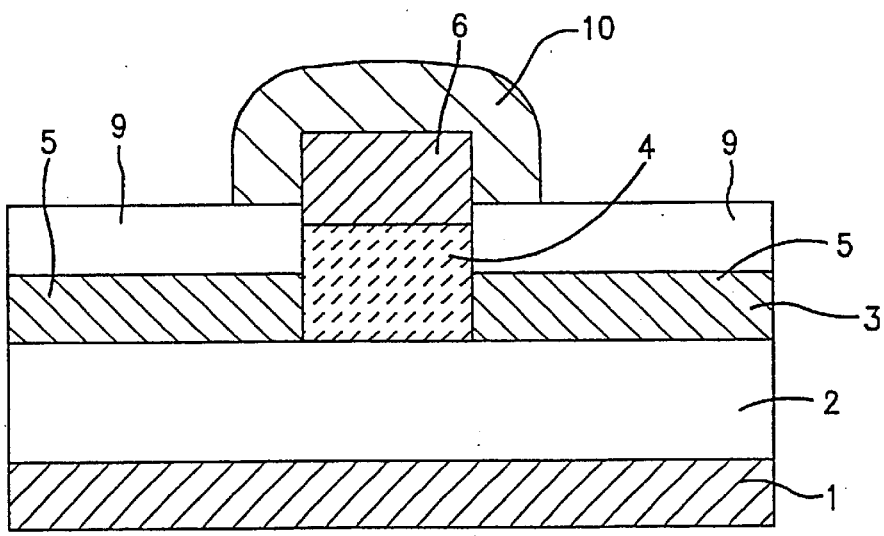
FIG. 8 is a fragmentary cross sectional elevation view illustrative of a novel body driven SOI-MOS field effect transistor in the second embodiment according to the present invention.

A second embodiment according to the present invention will be described in detail with reference to FIG. 8. FIG. 8 is a fragmentary cross sectional elevation view illustrative of a novel body driven SOI-MOS field effect transistor in the second embodiment according to the present invention. A transistor of the second embodiment is structurally different from that in the first embodiment as follows. The p-type region 4 extends upwardly by 40 nanometers from top surfaces of the source/drain regions 5. A top gate electrode 6 is provided on the p-type region 4. The top gate electrode 6 comprises a p+-region. The top gate electrode 6 has the same width as the p+-type region 4 and a height of 100 nanometers. Oxide films 9 having a thickness of 50 nanometers are provided on the source/drain regions 5. A metal layer 10 made of tungsten having a thickness of 100 nanometers is provided which surrounds the top gate electrode 6. The metal layer 10 serves as a part of the top gate electrode. At least a part of the top gate electrode 6 comprises a different material such as metal or metal silicide from the second conductivity type high impurity concentration region. As a metal layer, not only tungsten but also molybdenum, copper and tantalum, aluminum and titanium are available. Alloys or metal silicides are also available.

The low resistive metal or metal silicide is in contact with the top portion and sides of the top gate electrode so as to reduce a resistance of the top gate electrode in a direction along the channel width. The low resistive metal or metal silicide is in contact with not only the top portion but also the sides of the top gate electrode so as to reduce a semiconductor-metal contact resistance between the semiconductor 6 and the metal 10 which constitute the top gate electrode.

Third Embodiment

Figure 9:
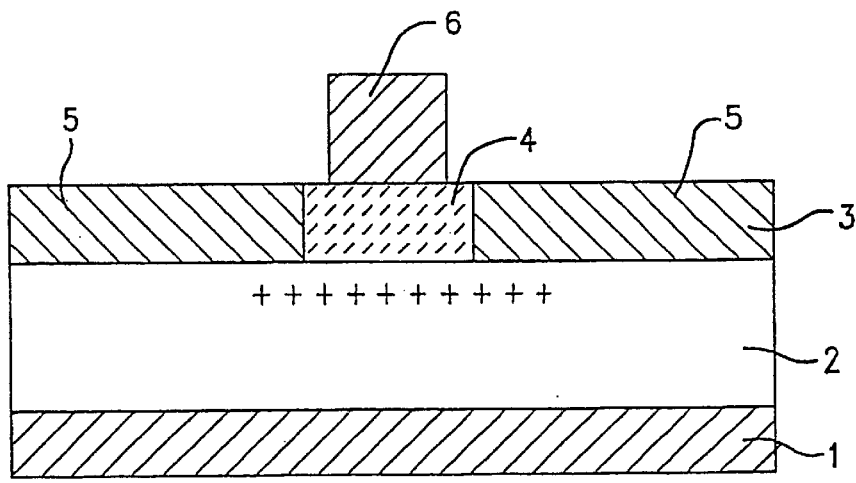
FIG. 9 is a fragmentary cross sectional elevation view illustrative of a novel body driven SOI-MOS field effect transistor in the third embodiment according to the present invention.

A third embodiment according to the present invention will be described in detail with reference to FIG. 9. FIG. 9 is a fragmentary cross sectional elevation view illustrative of a novel body driven SOI-MOS field effect transistor in the third embodiment according to the present invention. A transistor of the third embodiment is structurally different from that in the first embodiment as follows. In this embodiment, the buried oxide layer 2 is introduced with positive charges at its position under the p-type region 4. The positive charge may be introduced by an ion-implantation of Si into the buried oxide layer to introduce defects so called E' center into the buried oxide layer. Alternatively, the buried oxide layer may be formed by a chemical vapor deposition or other method to introduce the defects thereinto as described above. The E' center means a defect generated by introducing silicon into silicon dioxide excessively. The introduced Si has dangling bonds which are enabled to bond with oxygen whereby positive charges are generated.

An electric field from the positive charge causes an inversion layer to be formed at a position under the p-type region 4. The positive charge has substantially the same effect as application of a positive voltage to the bottom gate electrode. In this embodiment, either a positive voltage or no voltage may be applied to the bottom gate electrode.

As a modification to the third embodiment, it is possible that the transistor has no bottom gate electrode.

If the above transistor is a p-channel transistor, negative charge is introduced into the silicon dioxide film by, for example, an ion-implantation of aluminum.

When the charges are introduced into the insulation layer under the semiconductor region, the electric field from the charges plays substantially the same roll as the electric field from the bottom gate electrode applied with the voltage, for which reason it is possible to reduce the voltage to be applied to the bottom electrode or to apply no voltage to the bottom electrode. Otherwise, it is possible to omit the bottom gate electrode.

Fourth embodiment

Figure 10:
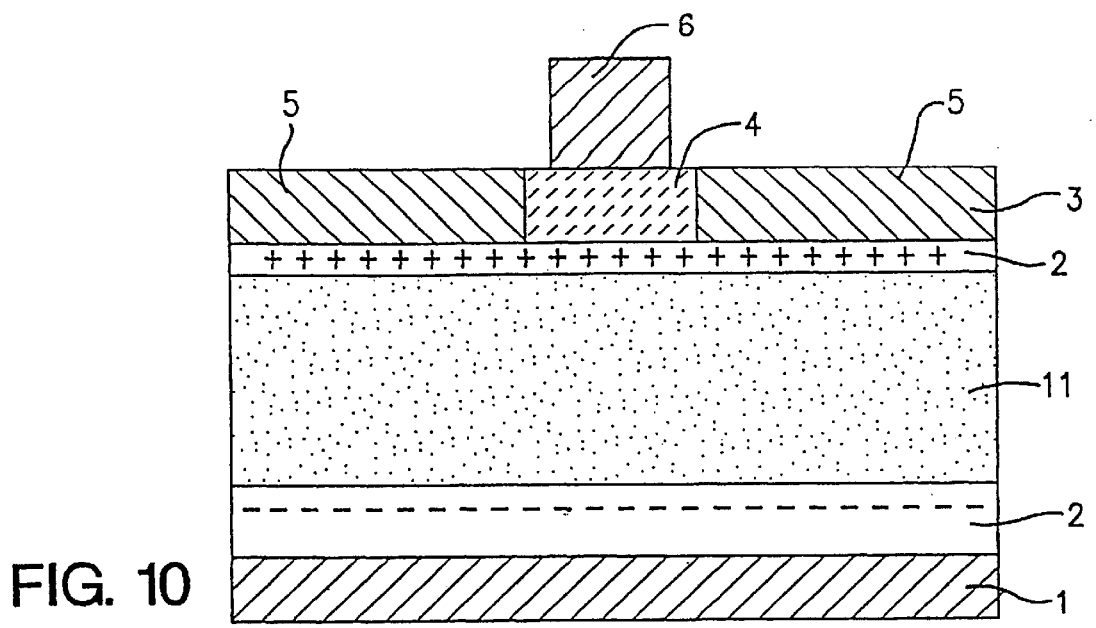
FIG. 10 is a fragmentary cross sectional elevation view illustrative of a novel body driven SOI-MOS field effect transistor in the fourth embodiment according to the present invention.

A fourth embodiment according to the present invention will be described in detail with reference to FIG. 10. FIG. 10 is a fragmentary cross sectional elevation view illustrative of a novel body driven SOI-MOS field effect transistor in the fourth embodiment according to the present invention. A transistor of the fourth embodiment is structurally different from that in the third embodiment as follows. In order to introduce the positive charge, a ferroelectric layer 11 is provided in the buried silicon oxide film 2. The ferroelectric layer 11 has a thickness of, for example, 300 nanometers. A thickness of the insulation layers 2 over and under the ferroelectric layer 11 is 50 nanometers. When the positive voltage is once applied to the bottom gate electrode, then the ferroelectric layer 11 is polarized so that the positively polarized charges are caused on the top interface of the ferroelectric layer 11 whilst the negatively polarized charges are caused on the bottom interface of the ferroelectric layer 11. Thereafter, when the bottom gate voltage is dropped to 0V, the polarized charges remain on the top and bottom interfaces of the ferroelectric layer 11. The positively polarized charges have substantially the same function as the positive charge in FIG. 9.

The amount of the polarized charge is varied by varying the positive voltage level applied to the bottom gate electrode. As a result, the threshold voltage is then varied. After the negative voltage is applied to the bottom gate electrode, then the voltage level is restored to lease the polarized charge or to invert the polarity of the polarized charge. The threshold voltage is adjusted to the desired level for various circuits by controlling the polarized charge.

For the ferroelectric layer 11, $BaTiO_3$, $SrTiO_3$, $PbTiO_3$, and other ferroelectric are available.

In this embodiment, the ferroelectric layer is buried in the insulation layer and polarized charges are caused on the interface of the ferroelectric layer and the insulation layer whereby the charges are introduced into the positions under the semiconductor layer. As a result, it is possible to omit the bottom gate electrode.

The ferroelectric layer is provided in the insulation layer under the semiconductor layer to generate polarized charges on the top and bottom interfaces of the ferroelectric layer to the insulation layer so that the positively polarized charge provides the electric field having substantially the same function as the electric field from the bottom gate electrode applied with the bottom gate voltage.

Fifth Embodiment

Figure 11:
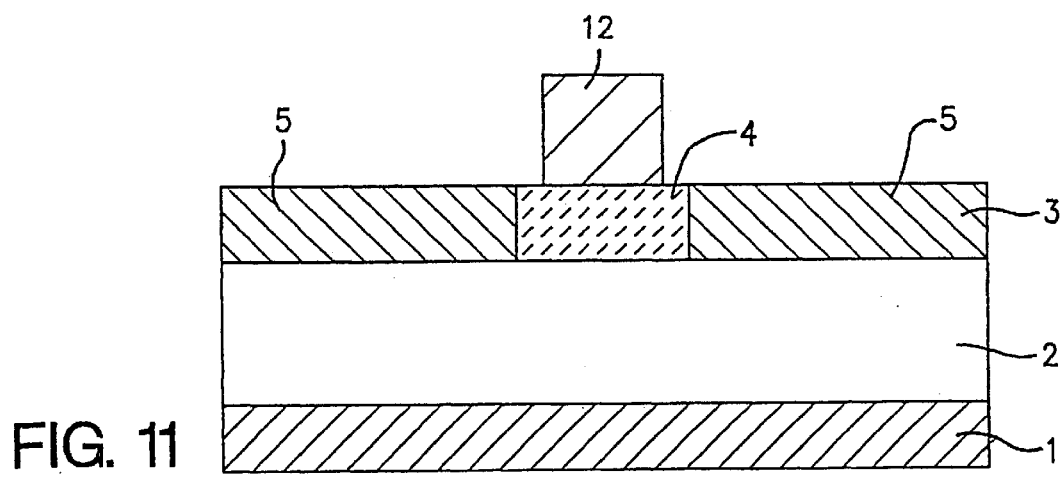
FIG. 11 is a fragmentary cross sectional elevation view illustrative of a novel body driven SOI-MOS field effect transistor in the fifth embodiment according to the present invention.

A fifth embodiment according to the present invention will be described in detail with reference to FIG. 11. FIG. 11 is a fragmentary cross sectional elevation view illustrative of a novel body driven SOI-MOS field effect transistor in the fifth embodiment according to the present invention. A transistor of the fifth embodiment is structurally different from that in the first embodiment as follows. The top gate electrode comprises tungsten in place of p+-type silicon to form a Schottky gate electrode 12.

A Schottky contact between the Schottky top gate electrode 12 and the p-type region 4 has a large resistance which may reduce a leak current between source/drain regions and the top gate electrode.

In this embodiment, of the top gate electrode, at least a part in contact with the low impurity concentration region, comprises a metal to form the Schottky contact between the top gate electrode and the semiconductor region whereby a leak current flowing from the top gate electrode into the semiconductor layer can be reduced.

Sixth Embodiment

Figure 12:
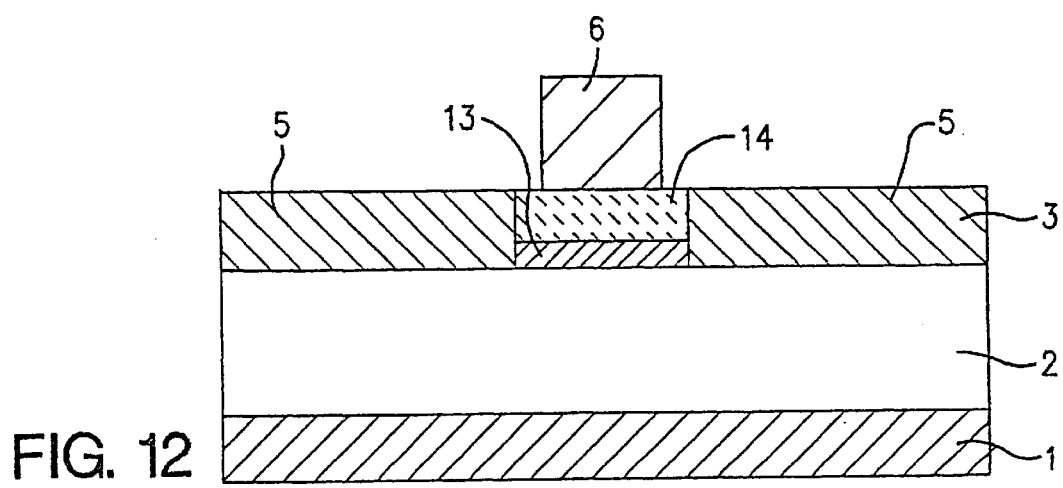
FIG. 12 is a fragmentary cross sectional elevation view illustrative of a novel body driven SOI-MOS field effect transistor in the sixth embodiment according to the present invention.

A sixth embodiment according to the present invention will be described in detail with reference to FIG. 12. FIG. 12 is a fragmentary cross sectional elevation view illustrative of a novel body driven SOI-MOS field effect transistor in the sixth embodiment according to the present invention. A transistor of the sixth embodiment is structurally different from that in the first embodiment as follows. In this embodiment, a p-channel transistor is provided, for which purpose an n-type region 14 is provided in place of the p-type region 4 and further under the n-type region 14 there is provided a narrow band gap region 13 of a semiconductor having a narrower band gap than a semiconductor of the n-type region 14. The bottom and top gate electrodes 1 and 6 and the source/drain regions 5 are of n+-type and the narrow band gap region 13 comprises an amorphous of n-type silicon and germanium.

Since the carrier concentration is high in the narrow band gap region, the inversion layer may readily be formed. This allows a reduction in a voltage to be applied between the bottom gate and the source electrode for forming the inversion layer.

Namely, at least a part of the bottom region of the low impurity concentration region comprises the narrower band gap semiconductor than that of the other region.

Since the narrow band gap semiconductor is provided on the bottom region of the low impurity concentration region, it is possible to increase the carrier concentration in the channel region. Germanium as a narrow band gap semiconductor has a large hole-mobility, for which reason the n-channel transistor structure in FIG. 4 and the p-channel transistor in FIG. 12 may be used to form CMOS circuit for obtaining high speed circuit operations.

Seventh Embodiment

Figure 13:
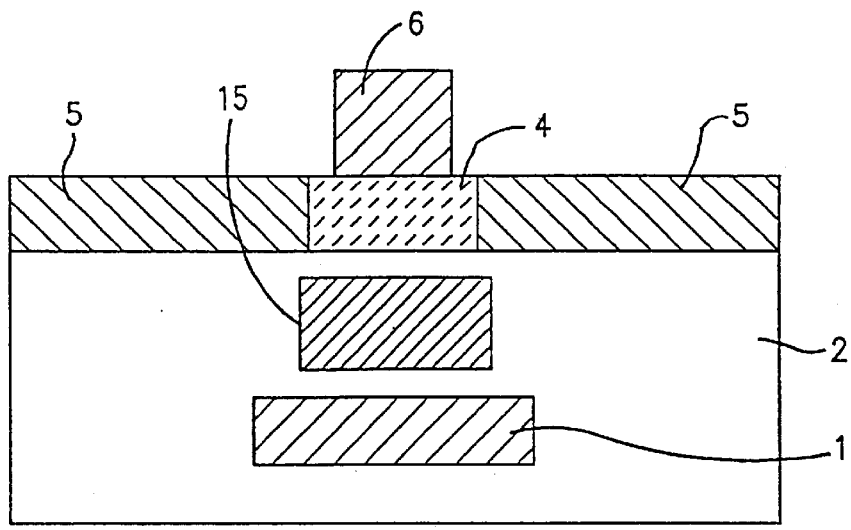
FIG. 13 is a fragmentary cross sectional elevation view illustrative of a novel body driven SOI-MOS field effect transistor in the seventh embodiment according to the present invention.

A seventh embodiment according to the present invention will be described in detail with reference to FIG. 13. FIG. 13 is a fragmentary cross sectional elevation view illustrative of a novel body driven SOI-MOS field effect transistor in the seventh embodiment according to the present invention. A transistor of the seventh embodiment is structurally different from that in the first embodiment as follows. A bottom gate 1 is formed to be surrounded by the buried insulation film 2. A floating gate electrode 15 is provided to be surrounded by the buried insulation film 2 and positioned between the bottom gate electrode I and the p-type region 4. A thickness of the buried insulation film 2 over and under the floating gate electrode 15 may be, for example, 30 nanometers.

Charges are injected from the bottom gate electrode I through the buried insulation film 2 into the floating gate electrode 15 or exhausted from the floating gate electrode 15 through the buried insulation film 2 to the bottom gate electrode 1. When the positive charge is injected into the floating gate electrode 15, substantially the same effects can be obtained as when the positive voltage is applied to the bottom gate electrode illustrated in FIG. 4. When the positive charge is exhausted from the floating gate electrode 15 or the negative charge is injected into the floating gate electrode 15, a threshold voltage of the transistor is increased. The threshold voltage of the circuit block in non-operational state in LSI circuits is increased in this manner to reduce a leak current which may flow in the transistor in OFF-state for reduction in power consumption of the transistor.

As a modification to the above seventh embodiment, a part of the bottom gate electrode is separated therefrom to be in the form of a floating gate electrode so that the charges are injected from the bottom gate electrode through the insulation layer into the floating gate electrode or exhausted from the floating gate electrode through the insulation layer to the bottom gate electrode. When the positive charge is injected into the floating gate electrode 15, substantially the same effects can be obtained as when the positive voltage is applied to the bottom gate electrode illustrated in FIG. 4. When the positive charge is exhausted from the floating gate electrode 15 or the negative charge is injected into the floating gate electrode 15, a threshold voltage of the transistor is increased. The threshold voltage of the circuit block in non-operational state in LSI circuits is increased in this manner to reduce a leak current which may flow in the transistor in OFF-state for reduction in power consumption of the transistor.

Eighth Embodiment

Figure 14:
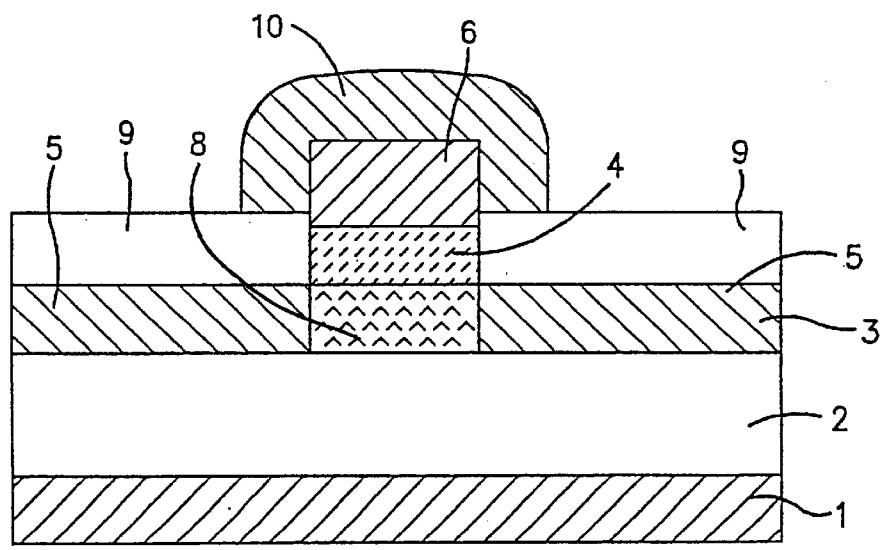
FIG. 14 is a fragmentary cross sectional elevation view illustrative of a novel body driven SOI-MOS field effect transistor in the eighth embodiment according to the present invention.

An eighth embodiment according to the present invention will be described in detail with reference to FIG. 14. FIG. 14 is a fragmentary cross sectional elevation view illustrative of a novel body driven SOI-MOS field effect transistor in the eighth embodiment according to the present invention. A transistor of the eighth embodiment is structurally different from that in the second embodiment as follows. A low region having a thickness of 10 nanometers of the p-type region 4 illustrated in FIG. 8 comprises an intrinsic semiconductor region 8. Only formation of a thin intrinsic semiconductor region can increase a gate-channel capacitance for improvement in controllability of the channel by the gate without formation of a thin gate oxide film.

Figure 15:
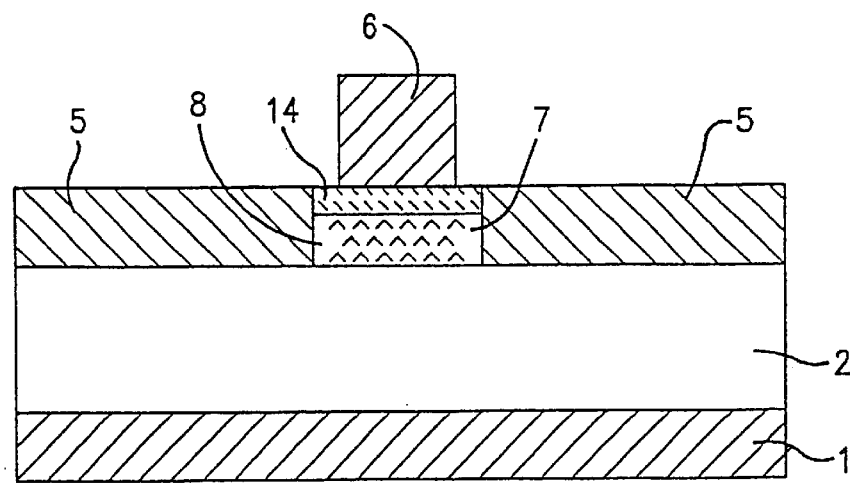
FIG. 15 is a fragmentary cross sectional elevation view illustrative of a novel body driven SOI-MOS field effect transistor in a modification to the eighth embodiment according to the present invention.

FIG. 15 is a fragmentary cross sectional elevation view illustrative of a novel body driven SOI-MOS field effect transistor in a modification to the eighth embodiment according to the present invention. In FIG. 15, an upper region of the intrinsic semiconductor region 8 comprises an n--type region 14. In the transistor of FIG. 4, a vertical field in the inversion layer 7 is lower when the impurity concentration of the p-type region is low or when the intrinsic semiconductor is formed. The vertical field is more low when the p-type region is replaced by the n-type region.

In the transistor of FIG. 15, the n--type region 14 is provided over the intrinsic semiconductor region 8 to relax the vertical field of the channel region 7. Relaxation of the vertical field of the channel region 7 results in increase in the carrier mobility of the channel whereby the current is increased. In addition, it is possible to reduce the voltage to be applied to the bottom gate electrode 1 for controlling the threshold voltage.

Figure 16:
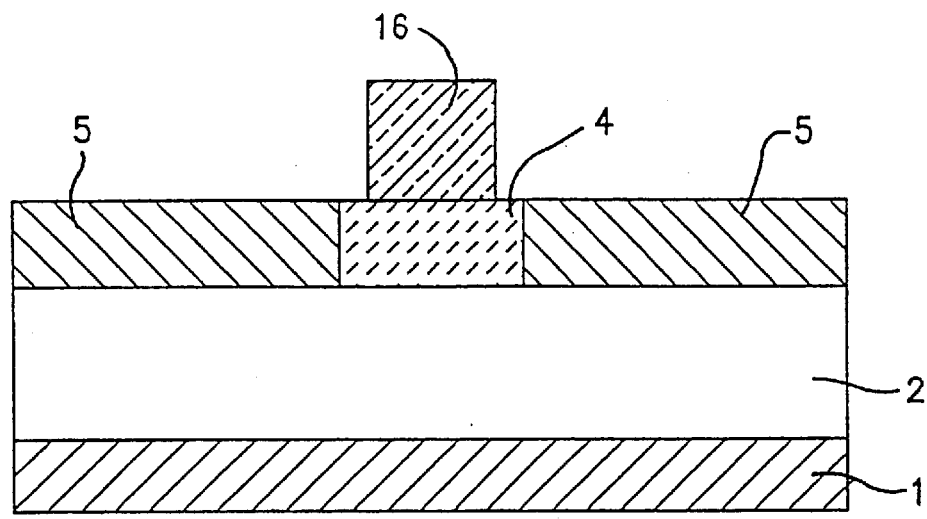
FIG. 16 is a fragmentary cross sectional elevation view illustrative of a novel body driven SOI-MOS field effect transistor in a further modification to the eighth embodiment according to the present invention.

FIG. 16 is a fragmentary cross sectional elevation view illustrative of a novel body driven SOI-MOS field effect transistor in a further modification to the eighth embodiment according to the present invention. The transistor in FIG. 16 structurally differs from that in FIG. 4 as follows. In place of the top gate 6 in FIG. 4, the transistor illustrated in FIG. 16 has a top gate 16 which comprises a semiconductor having a wider band gap than those of the source/drain regions 5 and the p-type region 4.

The leak current between the top gate electrode and the source region depends upon the band gap of the top gate electrode. A wide band gap can reduce the leak current. In the light of this, the transistor in FIG. 16 has the top gate 16 having a wider band gap for reduction of the gate source leak current.

The top gate electrode 16 may comprise a semiconductor material which satisfy the above requirement for band gap. If the source/drain regions 5 and the p-type region 4 are made of silicon, then the top gate electrode 16 may be made of SiC, GaAs, AlGaAs and other wider band gap semiconductors.

Ninth Embodiment

Figure 17:
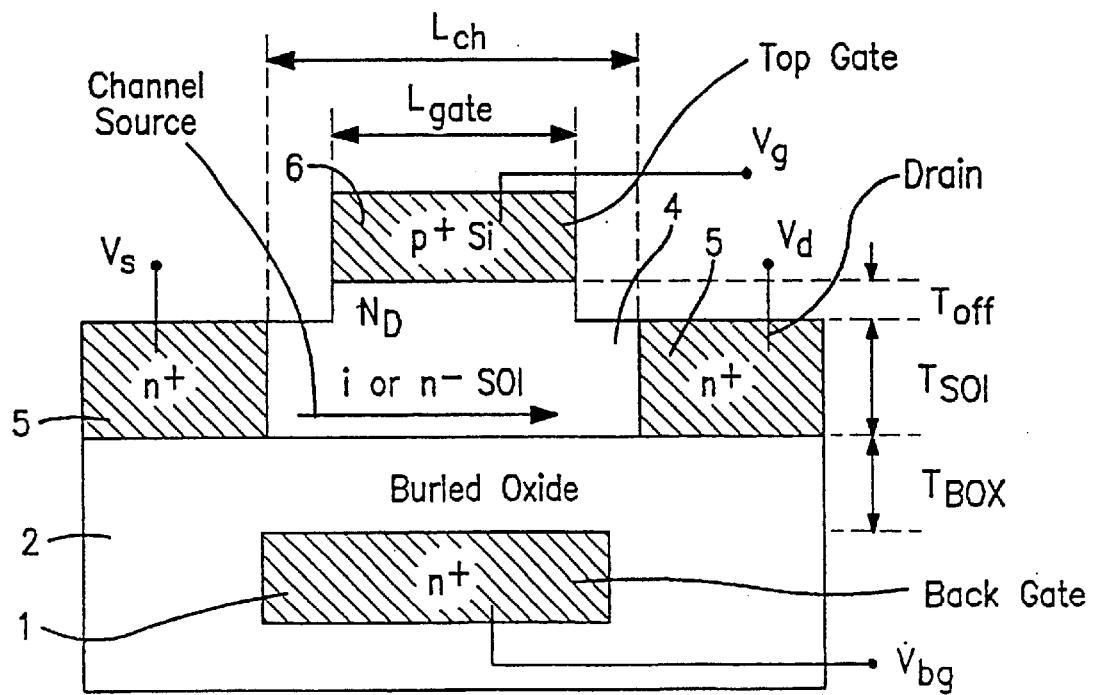
FIG. 17 is a fragmentary cross sectional elevation view illustrative of a novel body driven SOI-MOS field effect transistor in the ninth embodiment according to the present invention.
Figure 18:
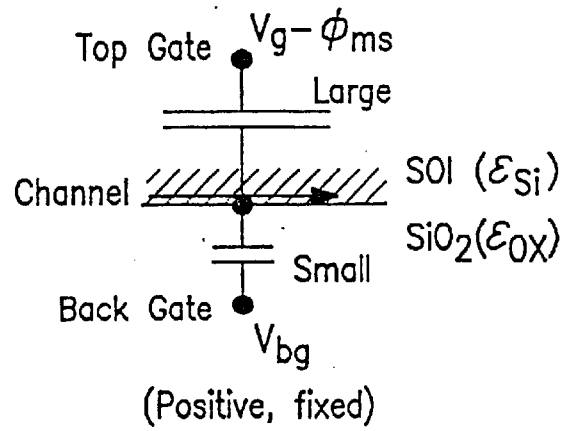
FIG. 18 is an equivalent circuit diagram of a novel body driven SOI-MOS field effect transistor in the ninth embodiment according to the present invention.

A ninth embodiment according to the present invention will be described in detail with reference to FIG. 17. FIG. 17 is a fragmentary cross sectional elevation view illustrative of a novel body driven SOI-MOS field effect transistor in the ninth embodiment according to the present invention. FIG. 18 is an equivalent circuit diagram of a novel body driven SOI-MOS field effect transistor in the ninth embodiment according to the present invention. A transistor of the ninth embodiment is structurally different from that in the first embodiment as follows. A bottom gate electrode (back gate) 1 is provided to be surrounded by the insulation layer 2. A top gate electrode 6 is vertically and horizontally off-set from the source/drain regions 5. The top gate electrode 6 comprise a p+-type region. The source/drain regions 5 comprise n+-type regions. The low impurity concentration region 4 may comprise an n--type region or an intrinsic region. A channel length Lch is 0.08 micrometers. A gate length Lgate is 0.06 micrometers. SOI thickness Tsoi is 10 nanometers. A buried oxide film thickness Tbox is 20 nanometers. A bottom gate voltage Vbg(back gate voltage) is 3.2V. A vertical off-set thickness Toff is 5 nanometers. Donor concentration Nd of the region 4 is zero. The applied voltage Vdd may be 0.5V.

The input signal is applied to the top gate electrode to control the body potential and thus the drain current. The excess holes accumulated in the SOI-body are removed through the top gate. A fixed positive voltage Vbg is applied to the bottom gate electrode (back gate) so that a channel is formed on the bottom of the SOI layer. The threshold voltage Vth is controllable by controlling the bottom gate voltage.

Figure 19:
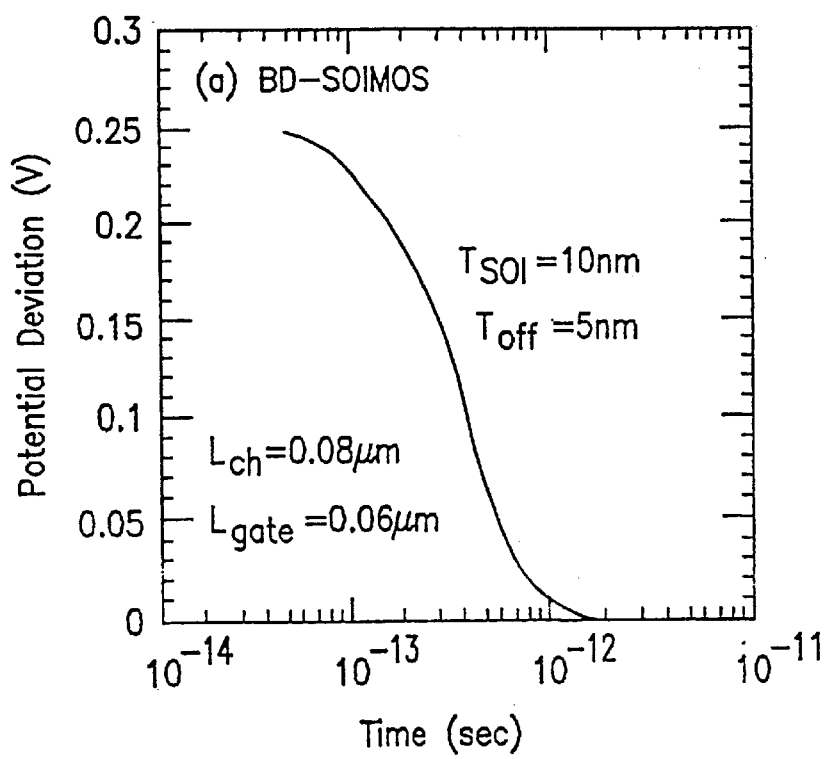
FIG. 19 is a diagram illustrative of variation in potential deviation over times of the novel transistor illustrated in FIG. 17.
Figure 20:
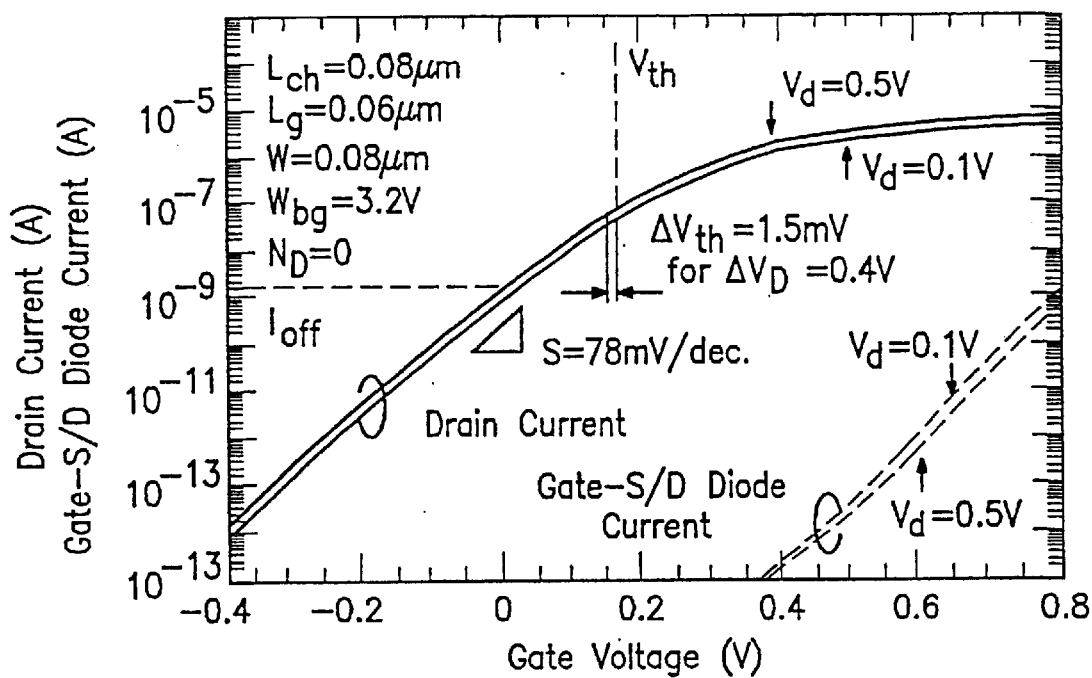
FIG. 20 is a diagram illustrative of dependence of drain current and diode current between gate and source/drain upon gate voltage of the novel transistor illustrated in FIG. 17.
Figure 21:
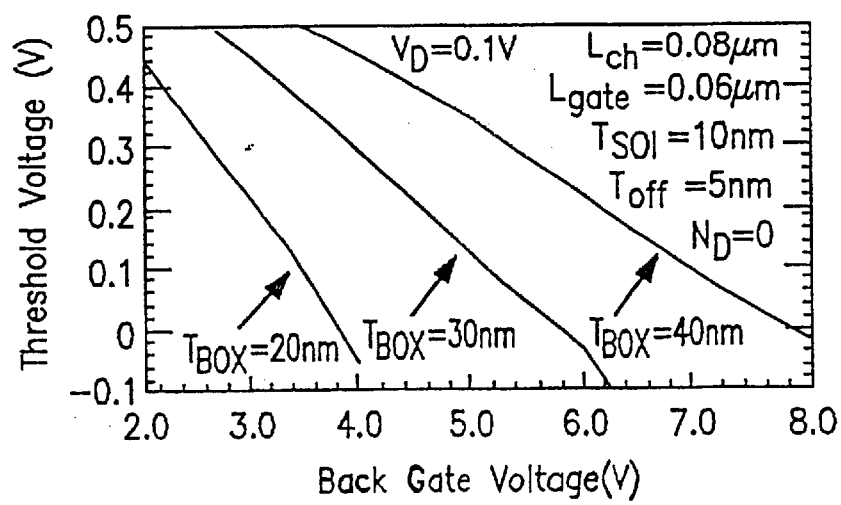
FIG. 21 is a diagram illustrative of threshold voltage dependency upon the bottom gate voltage (back gate voltage) applied to the bottom gate electrode (back gate electrode).

The above off-set top gate structure is adopted to weaken the electric field in the SOI layer for reducing the band-to-band tunneling current. The maximum electric field in the SOI layer does not exceed $10^6$ V/cm at the OFF condition. It was confirmed that the holes are removed within several pico-seconds after excess holes are induced as illustrated in FIG. 19 which is a diagram illustrative of variation in potential deviation over times of the novel transistor illustrated in FIG. 17. An enhancement mode operation (positive Vth, 0.16V) a small S-factor (78 m V/dec.) and a small Vth roll-off ($\Delta$ Vth=15 m V/$\Delta$ Vd=0.4 m V) were confirmed as illustrated in FIG. 20 which is a diagram illustrative of dependence of drain current and diode current between the top gate and source/drain regions upon gate voltage of the novel transistor illustrated in FIG. 17. The diode current between the source/drain regions and the top gate electrode at Vg-Vdd($<10^{12}$A) is smaller than the off current at Vg=0V. It was also confirmed that Vth can be controlled by varying Vbg as illustrated in FIG. 21 which is a diagram illustrative of threshold voltage dependency upon the bottom gate voltage (back gate voltage) applied to the bottom gate electrode (back gate electrode).

Tenth Embodiment

Figure 22:
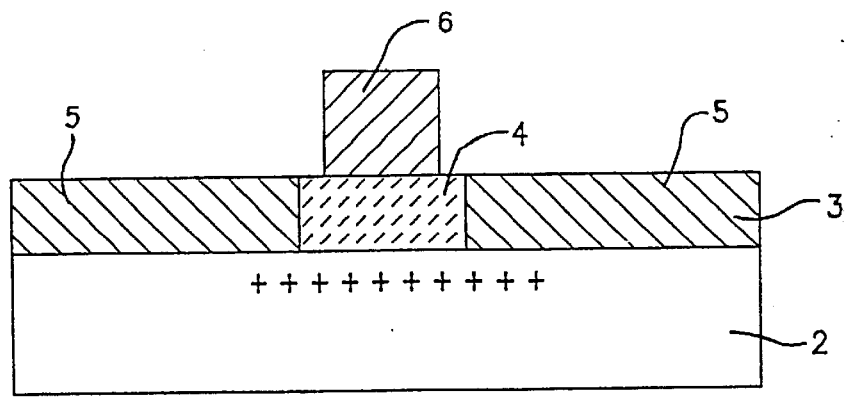
FIG. 22 is a fragmentary cross sectional elevation view illustrative of a novel body driven SOI-MOS field effect transistor in the tenth embodiment according to the present invention.

A tenth embodiment according to the present invention will be described in detail with reference to FIG. 22. FIG. 22 is a fragmentary cross sectional elevation view illustrative of a novel body driven SOI-MOS field effect transistor in the tenth embodiment according to the present invention. A transistor of the tenth embodiment is structurally different from that in the first embodiment as follows. In this embodiment, no bottom gate electrode is provided but the buried oxide layer 2 is introduced with positive charges at its position under the p-type region 4. The positive charge may be introduced by an ion-implantation of Si into the buried oxide layer to introduce defects so called E' center into the buried oxide layer. Alternatively, the buried oxide layer may be formed by a chemical vapor deposition or other method to introduce the defects thereinto as described above. The E' center means a defect generated by introducing silicon into silicon dioxide excessively. The introduced Si has dangling bonds which are able to bond with oxygen whereby positive charges are generated.

An electric field from the positive charge can cause an inversion layer to be formed at position under the p-type region 4 despite of no bottom gate electrode. The positive charge has substantially the same effect as application of a positive voltage to a bottom gate electrode. In this embodiment, either a positive voltage or no voltage may be applied to the bottom gate electrode.

As a modification to the third embodiment, it is possible that the transistor has no bottom gate electrode.

If the above transistor is a p-channel transistor, negative charge is introduced into the silicon dioxide film by, for example, an ion-implantation of aluminum.

When the charges are introduced into the insulation layer under the semiconductor region, the electric field from the charges plays substantially the same roll as the electric field from the bottom gate electrode applied with the voltage, for which reason it is possible to reduce the voltage to be applied to the bottom electrode or to apply no voltage to the bottom electrode. Otherwise, it is possible to omit the bottom gate electrode.

Eleventh Embodiment

Figure 23:
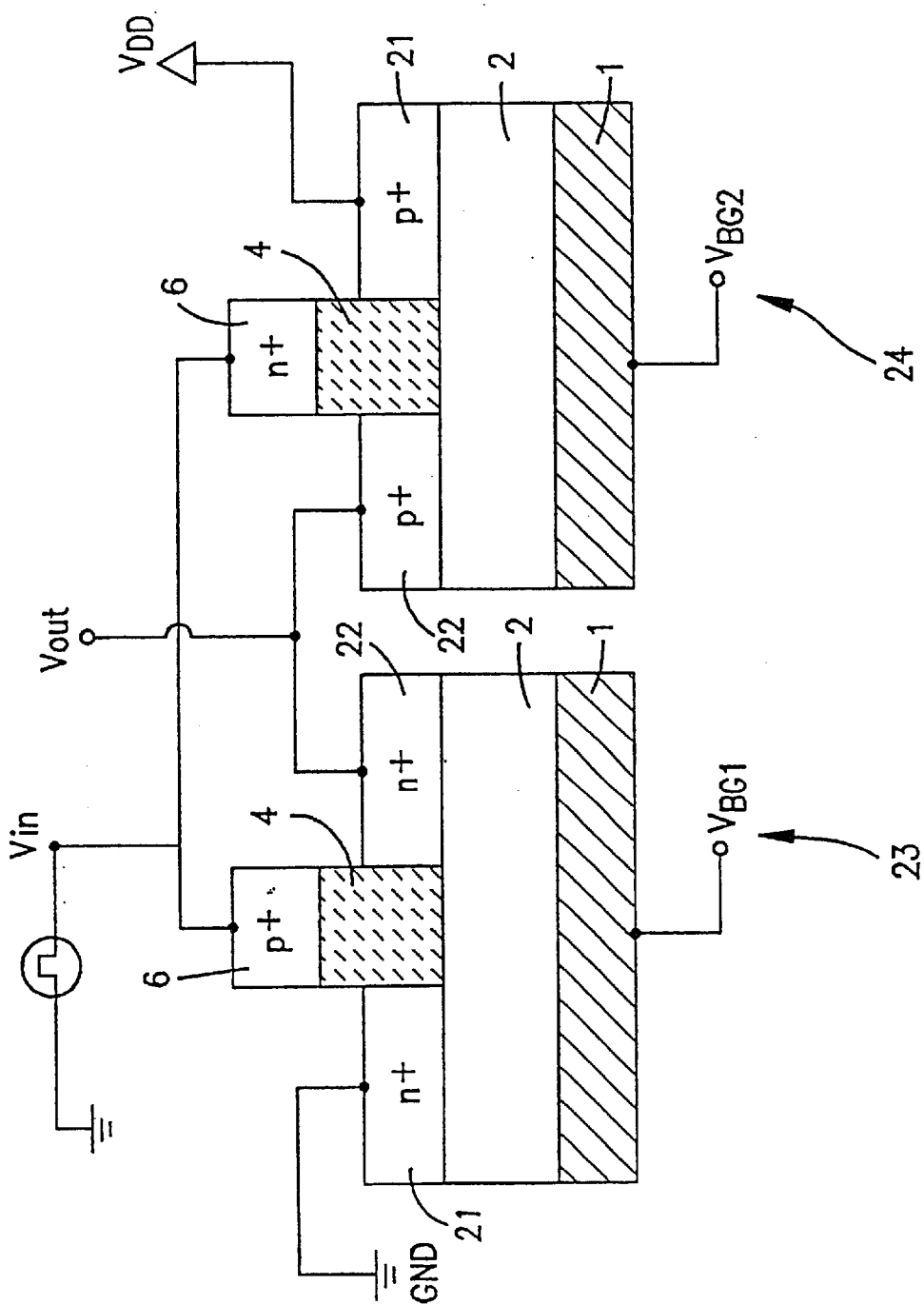
FIG. 23 is a fragmentary cross sectional elevation view illustrative of a CMOS circuit using novel body driven n-channel and p-channel SOI-MOS field effect transistors according to the present invention.

An eleventh embodiment according to the present invention will be described in detail with reference to FIG. 23. FIG. 23 is a fragmentary cross sectional elevation view illustrative of a CMOS circuit using novel n-channel and p-channel body driven SOI-MOS field effect transistors according to the present invention, wherein the n-channel body driven SOI-MOS field effect transistor is one illustrated in FIG. 4.

Input signals Vin are inputted into the top gate electrodes 6 of the n-channel and p-channel transistors 23 and 24. Drain regions of the n-channel and p-channel transistors 23 and 24 are connected to each other and output signals Vout is fetched from the drain regions 22 thereof. A source region of the p-channel transistor 24 is connected to a power supply whilst a source region 21 of the n-channel transistor 23 is grounded.

The above CMOS circuit serves as an invertor circuit for inversion of the input signals. A power voltage Vdd may be, for example, 0.5V. A voltage VBG1 is +10V to be applied to the bottom gate electrode 1 of the n-channel transistor 23. A voltage VBG2 is −10V to be applied to the bottom gate electrode 1 of the p-channel transistor 24.

The above transistors described above are applicable to not only the invertor but also any other logic circuits such as NAND gate, NOR gate, flip-flop and the others.

Figure 24:
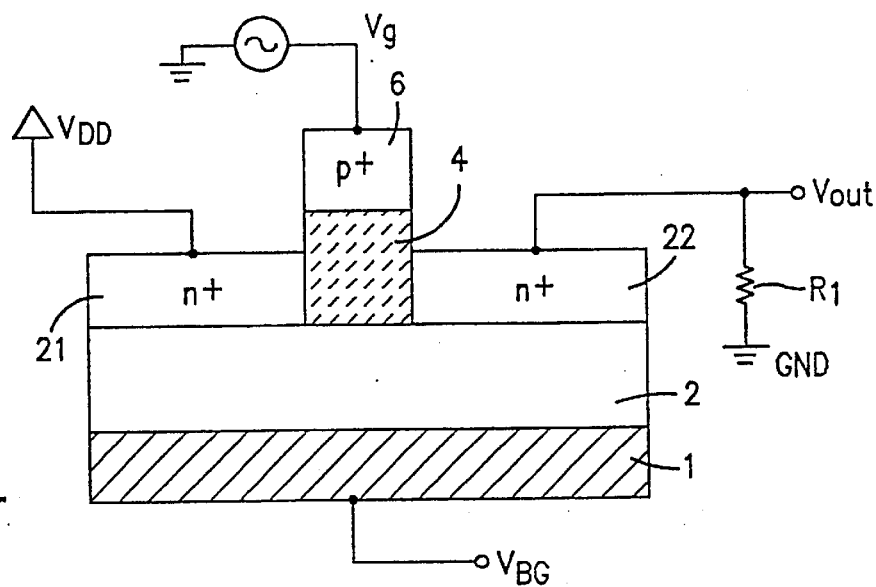
FIG. 24 is a fragmentary cross sectional elevation view illustrative of a novel body driven SOI-MOS field effect transistor used as a resistive load according to the present invention.

The above transistors described above are also applicable to not only the CMOS circuit but also other circuitry and any other circuits than the logic circuits. FIG. 24 is a fragmentary cross sectional elevation view illustrative of a novel body driven SOI-MOS field effect transistor used as a resistive load according to the present invention. For example, as illustrated in FIG. 24, in order to form a resistance load, the source region 21 is connected to the power voltage Vdd, an input voltage Vg is applied to the top gate electrode 6 and the drain region 22 is connected to a load resistance R1.

Figure 25:
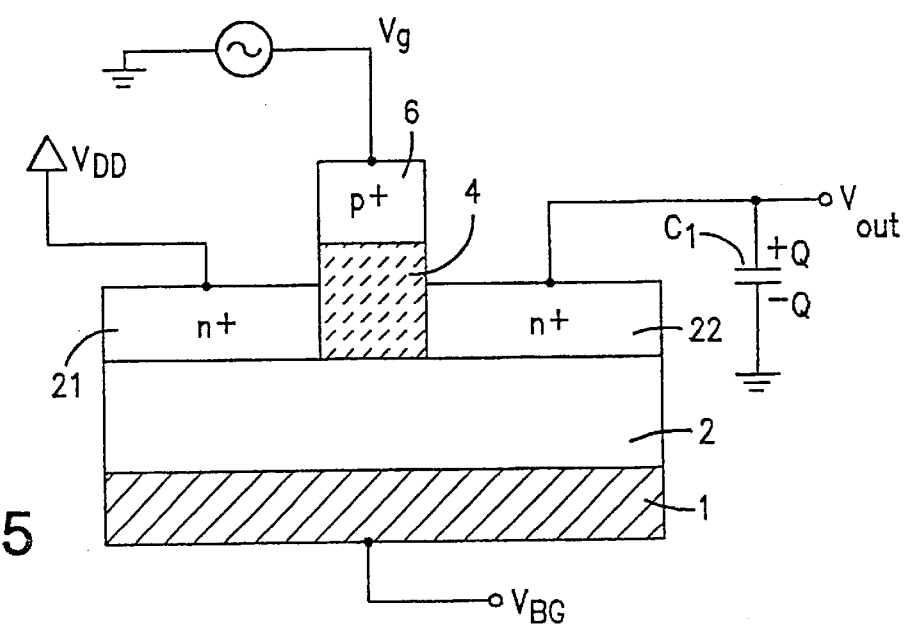
FIG. 25 is a fragmentary cross sectional elevation view illustrative of a novel body driven SOI-MOS field effect transistor used as a resistive load according to the present invention.

FIG. 25 is a fragmentary cross sectional elevation view illustrative of a novel body driven SOI-MOS field effect transistor used as a resistive load according to the present invention. For example, as illustrated in FIG. 25, in order to form a capacitive load, the source region 21 is connected to the power voltage Vdd, an input voltage Vg is applied to the top gate electrode 6 and the drain region 22 is connected to a load capacitance C1.

In accordance with the present invention, the threshold voltage of the transistor is controlled by and also the leak current under OFF conditions are reduced by controlling the bottom gate voltage or the polarized charge of the ferroelectric layer in the insulation layer. The power consumption is thereby reduced.

The impurity concentration of the second conductivity type region in which a channel of the first conductivity type is formed is reduced and is lower than those of the regions around this region or the top gate electrode region of the second conductivity type, otherwise this region comprises an intrinsic region so as to reduce an impurity scattering in the channel region whereby the current value is increased and the parasitic capacitance between the second conductivity region and the source/drain regions is reduced.

The first and second conductivity type high impurity concentrations are separated in horizontal or vertical direction to prevent a band-to-band tunneling current leak current at p-n junction.

The following descriptions will focus on fabrication processes for the above described novel transistor. A first method of fabricating the above novel transistor will be described with reference to FIGS. 26 through 36.

Figure 26:
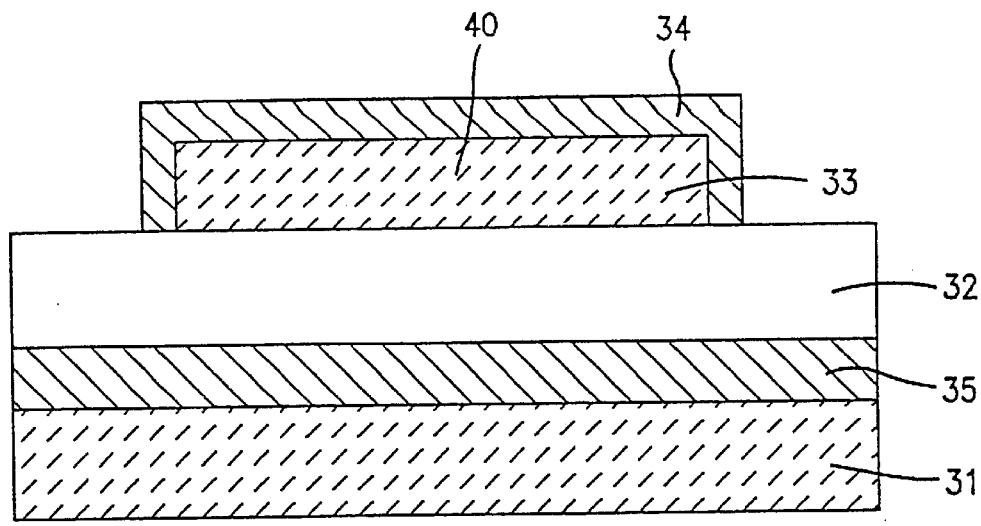
FIG. 26 is a fragmentary cross sectional elevation view illustrative of a novel body driven SOI-MOS field effect transistor in first step in sequential fabrication processes involved in a first fabrication method.

With reference to FIG. 26, a buried oxide film 32 having a thickness of 80 nanometers is formed over a silicon substrate 31. An SOI layer 33 having a thickness of 200 manometers is formed over the buried oxide film 32. Boron is implanted at 180 keV to $1\times10^{18}$ cm$^{-3}$ for subsequent heat treatment of the wafer at 800° C. for 10 minutes to form a p-type region 35 in upper region of the silicon substrate 31.

Boron is obliquely implanted at 10 keV to $1\times10^{19}$ cm$^{-3}$ to form a p+-region 34 which extends over the top and on the sides of the SOI layer 33. Further, boron is implanted at 80 keV to $1\times10^{17}$ cm$^{-3}$ to form a p-type region with a low impurity concentration within the SOI layer 33.

Figure 27A:
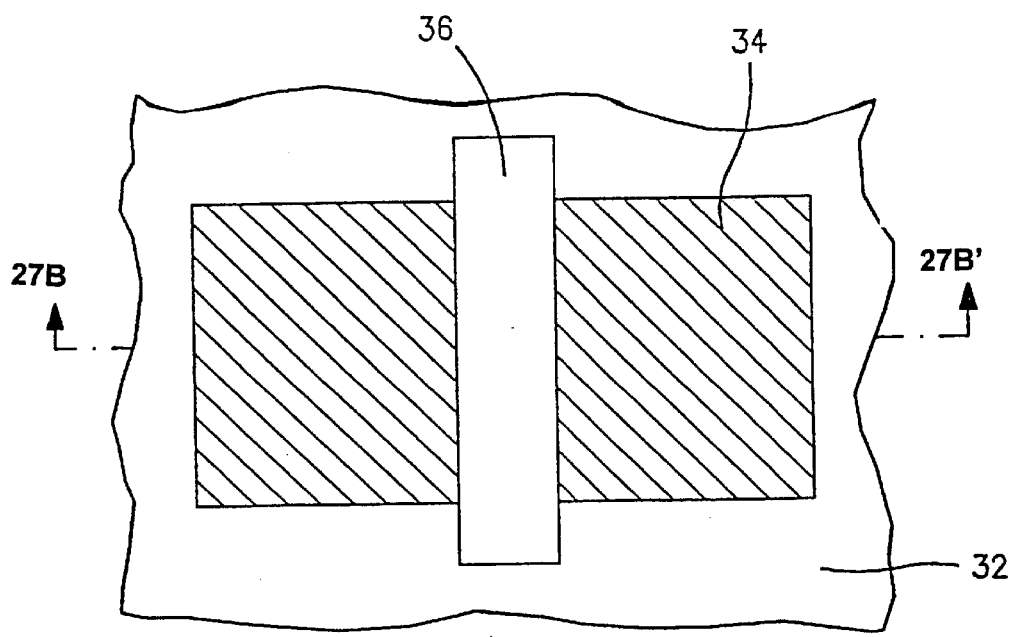
FIG. 27A is a plane view illustrative of a novel body driven SOI-MOS field effect transistor in second step in sequential fabrication processes involved in a first fabrication method.
Figure 27B:
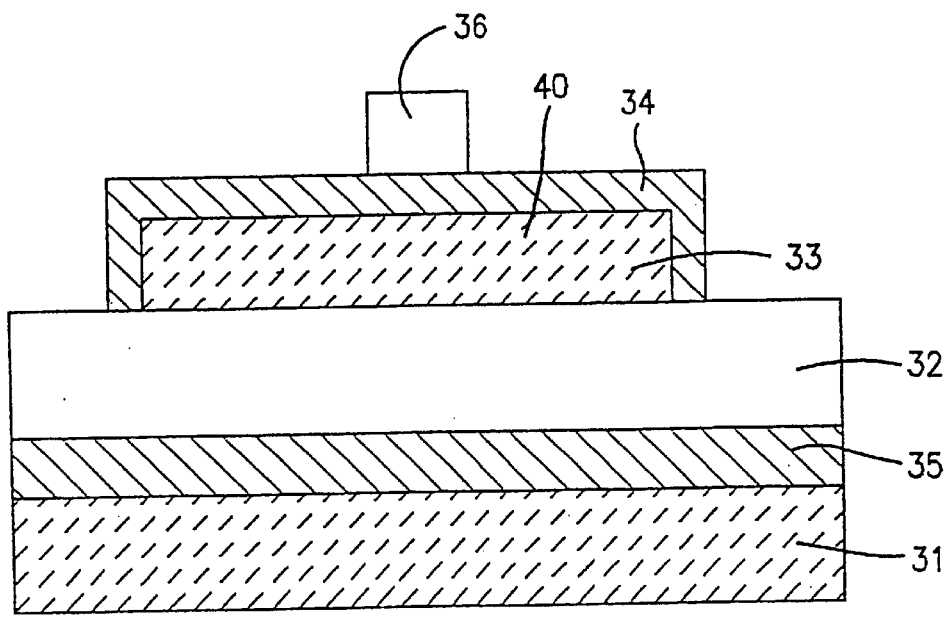
FIG. 27B is a fragmentary cross sectional elevation view taken along 27B–27B' line in FIG. 27A illustrative of a novel body driven SOI-MOS field effect transistor in second step in sequential fabrication processes involved in a first fabrication method.

With reference to FIGS. 27A and 27B, a first oxide film 36 having a thickness of 100 nanometers is deposited by a chemical vapor deposition over the p+-region 34 and the buried oxide film 32. The first oxide film 36 is patterned by photo-lithography and subsequent reactive ion etching so that the first oxide film 36 remains across the center of the p+-region 34.

Figure 28A:
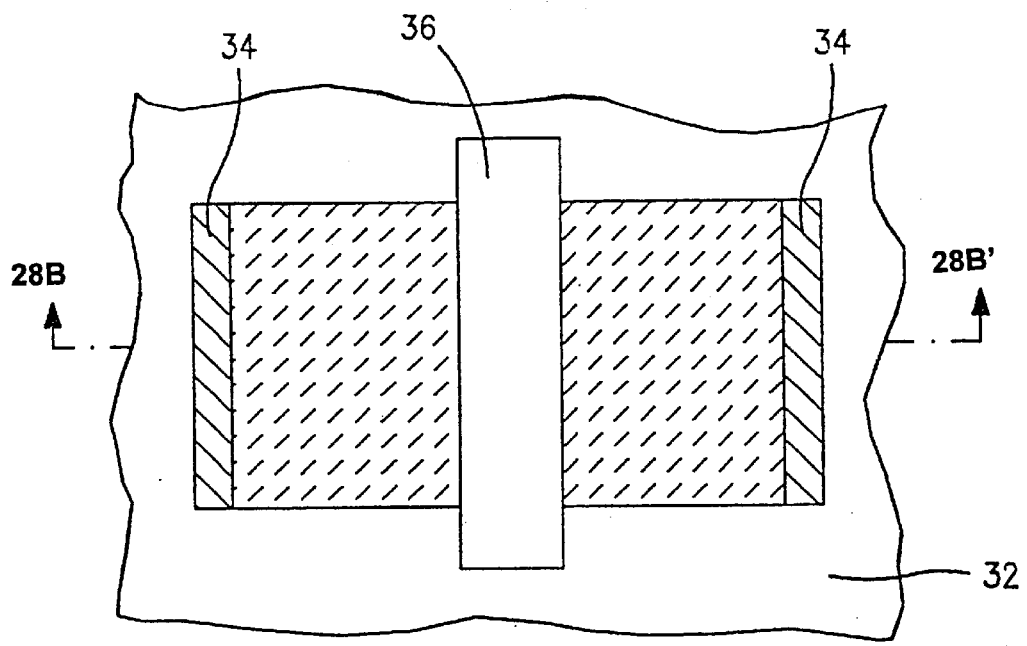
FIG. 28A is a plane view illustrative of a novel body driven SOIMOS field effect transistor in third step in sequential fabrication processes involved in a first fabrication method.
Figure 28B:
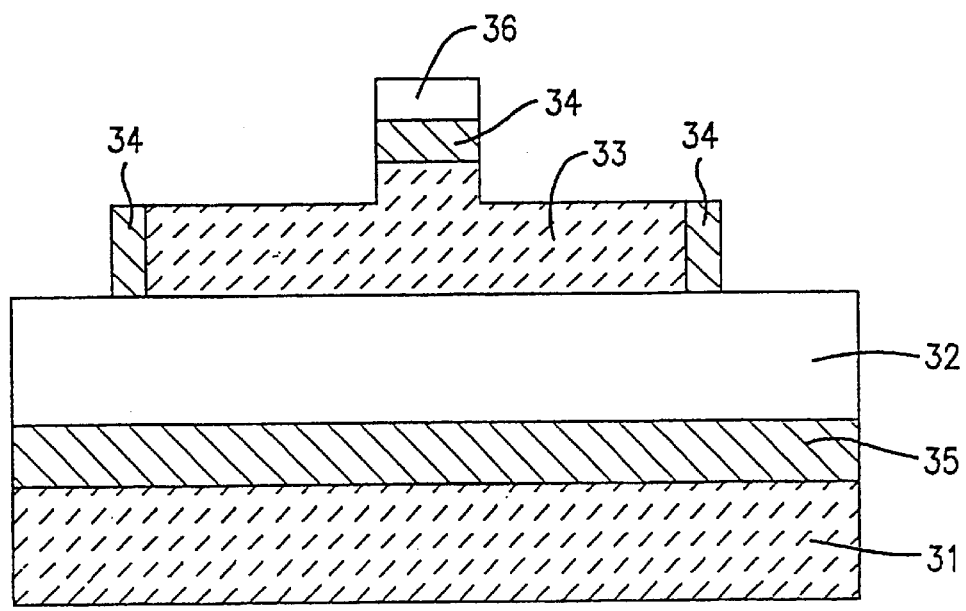
FIG. 28B is a fragmentary cross sectional elevation view taken along 28B–28B' line in FIG. 28A illustrative of a novel body driven SOI-MOS field effect transistor in third step in sequential fabrication processes involved in a first fabrication method.

With reference to FIGS. 28A and 28B, the first oxide film 36 is used as a mask for carrying out a reactive ion etching to the SOI film 33 and the p+-region 34 by a depth of 190 nanometers.

Figure 29:
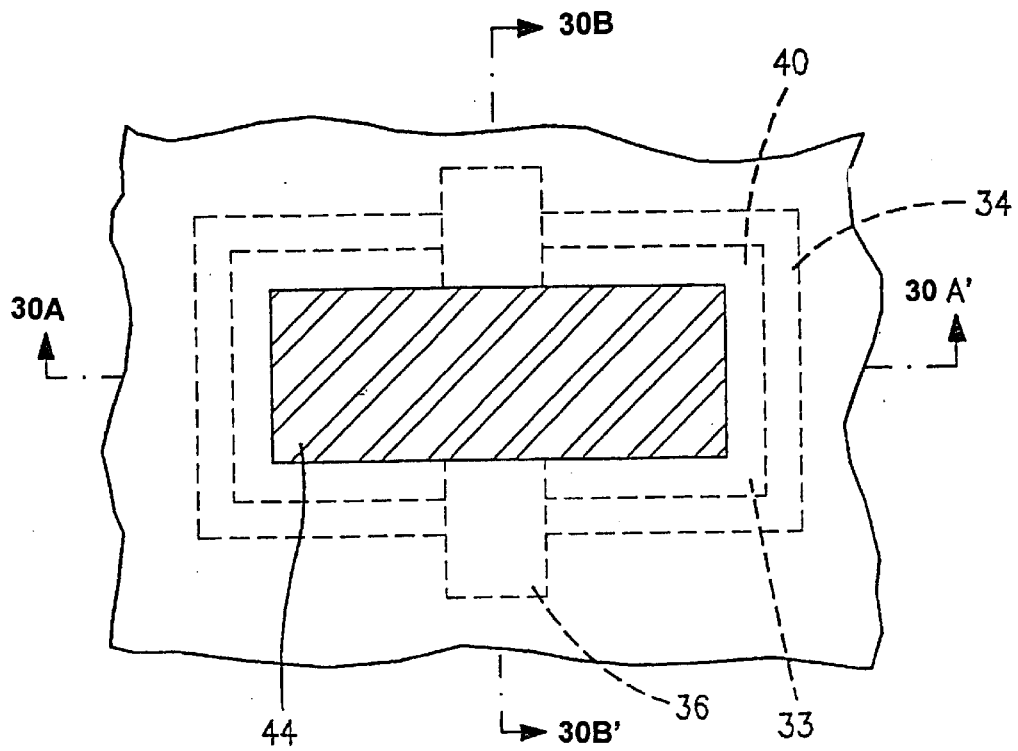
FIG. 29 is a plane view illustrative of a novel body driven SOIMOS field effect transistor in fourth step in sequential fabrication processes involved in a first fabrication method.
Figure 30A:
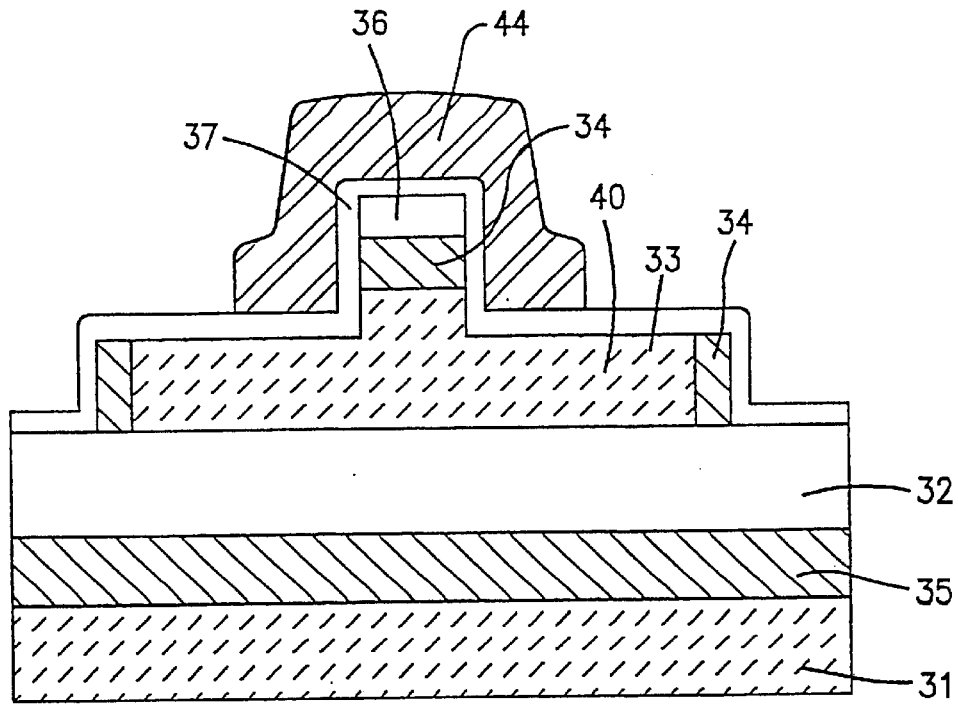
FIG. 30A is a fragmentary cross sectional elevation view taken along 30A–30A' line in FIG. 29 illustrative of a novel body driven SOI-MOS field effect transistor in fourth step in sequential fabrication processes involved in a first fabrication method.
Figure 30B:
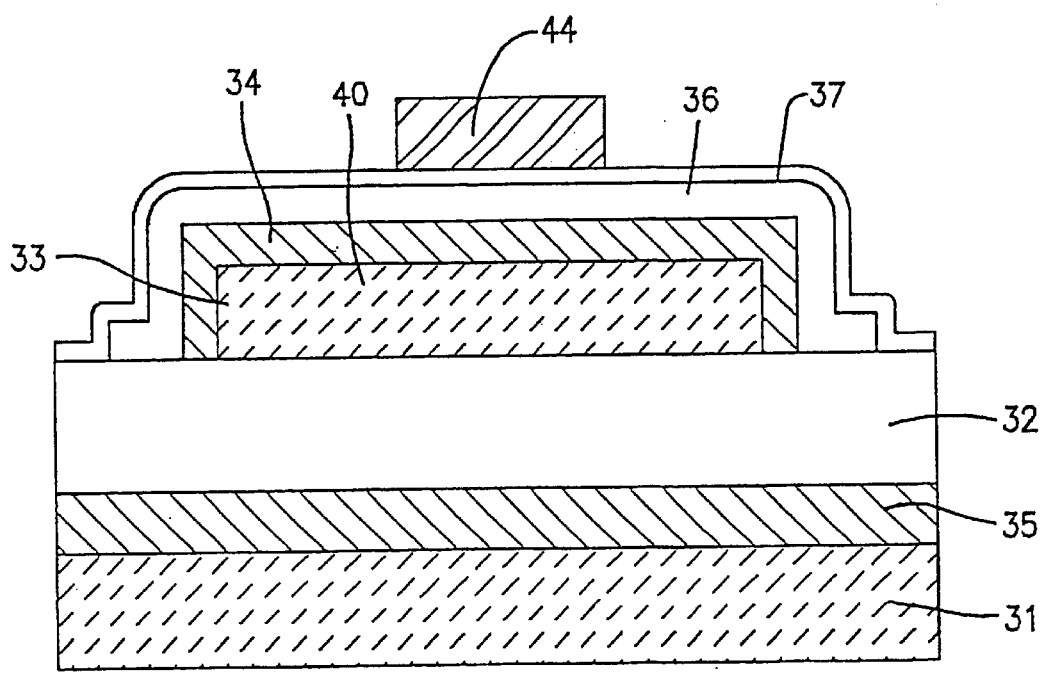
FIG. 30B is a fragmentary cross sectional elevation view taken along 30B–30B' line in FIG. 29 illustrative of a novel body driven SOI-MOS field effect transistor in fourth step in sequential fabrication processes involved in a first fabrication method.
Figure 31:
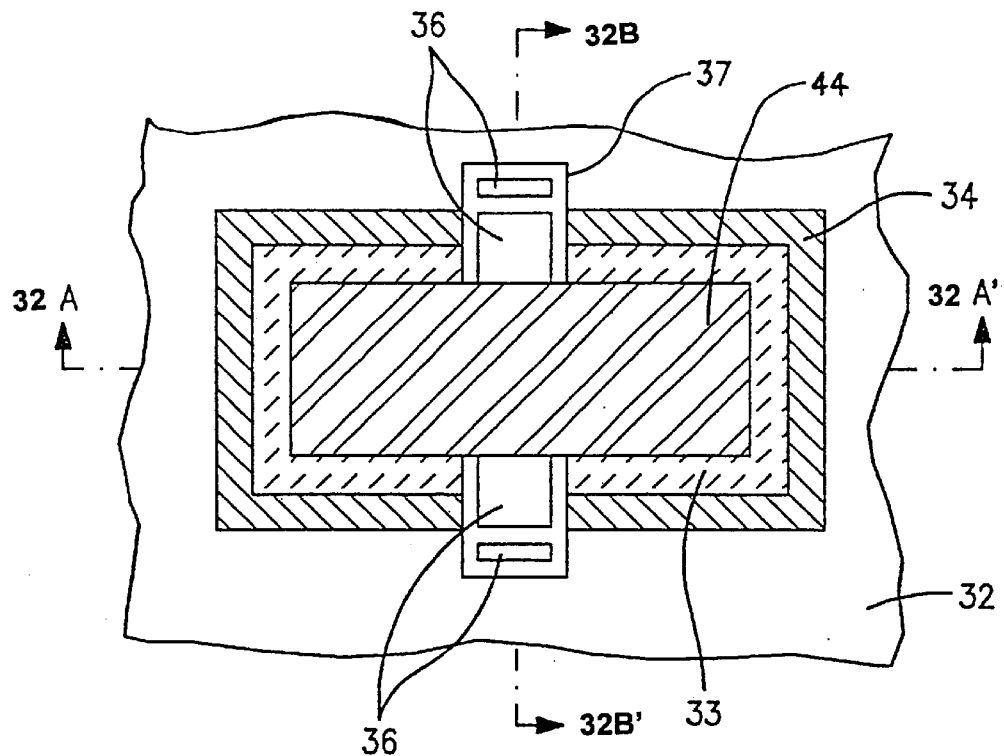
FIG. 31 is a plane view illustrative of a novel body driven SOI-MOS field effect transistor in fifth step in sequential fabrication processes involved in a first fabrication method.
Figure 32A:
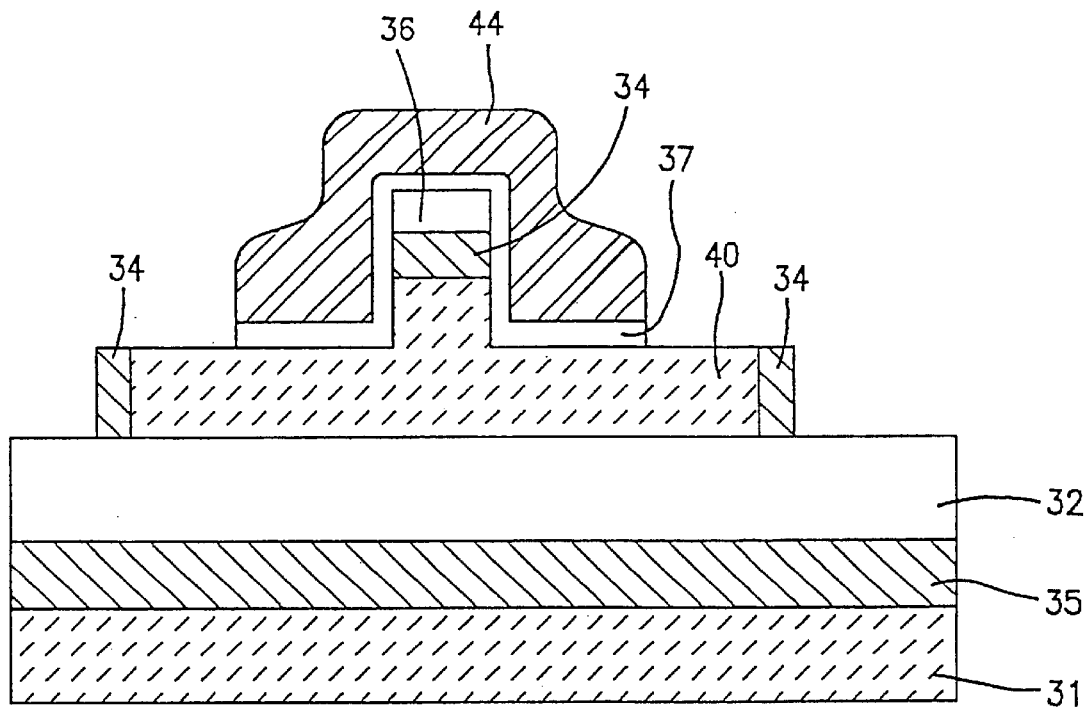
FIG. 32A is a fragmentary cross sectional elevation view taken along 32A–32A' line in FIG. 31 illustrative of a novel body driven SOI-MOS field effect transistor in fifth step in sequential fabrication processes involved in a first fabrication method.
Figure 32B:
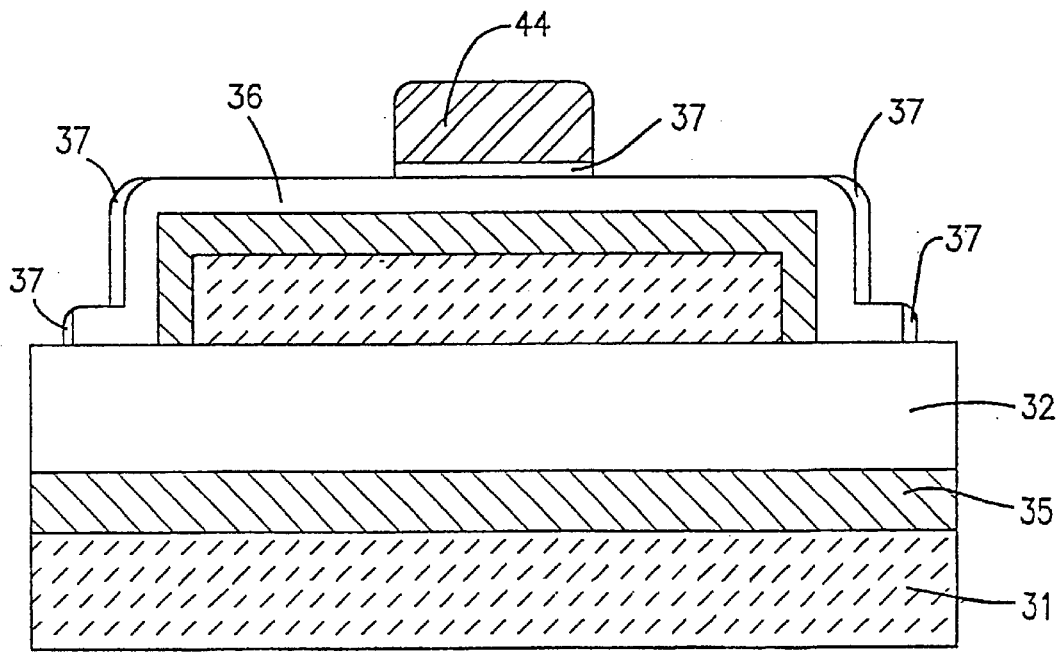
FIG. 32B is a fragmentary cross sectional elevation view taken along 32B–32B' line in FIG. 31 illustrative of a novel body driven SOI-MOS field effect transistor in fifth step in sequential fabrication processes involved in a first fabrication method.

With reference to FIGS. 29, and 30A and 30B, a second oxide film 37 having a thickness of 20 nanometers is deposited by a chemical vapor deposition and then patterned by a photo-lithography and a subsequent reactive ion etching so that the second oxide film 37 remains across the first oxide film 36 at the right angle. A photo-resist film 44 is provided which covers the second oxide film 37 for selective etching to the second oxide film 37 so that the second oxide film 37 remains around a stepped portion of the first oxide film 36 as illustrated in FIGS. 31, and 32A and 32B.

Figure 33:
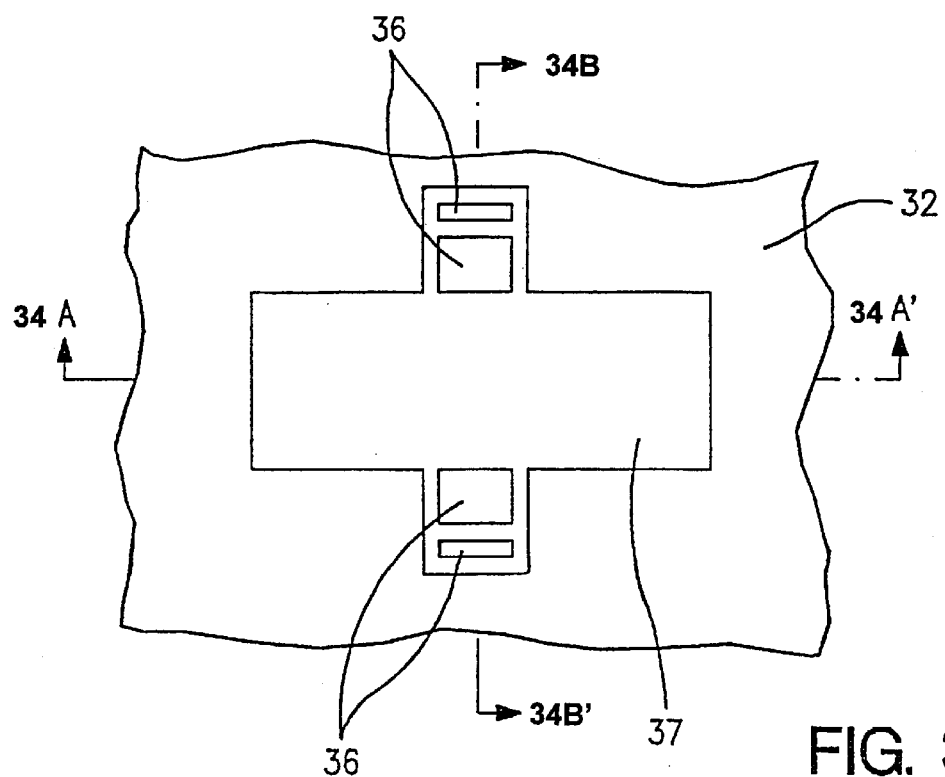
FIG. 33 is a plane view illustrative of a novel body driven SOI-MOS field effect transistor in sixth step in sequential fabrication processes involved in a first fabrication method.
Figure 34A:
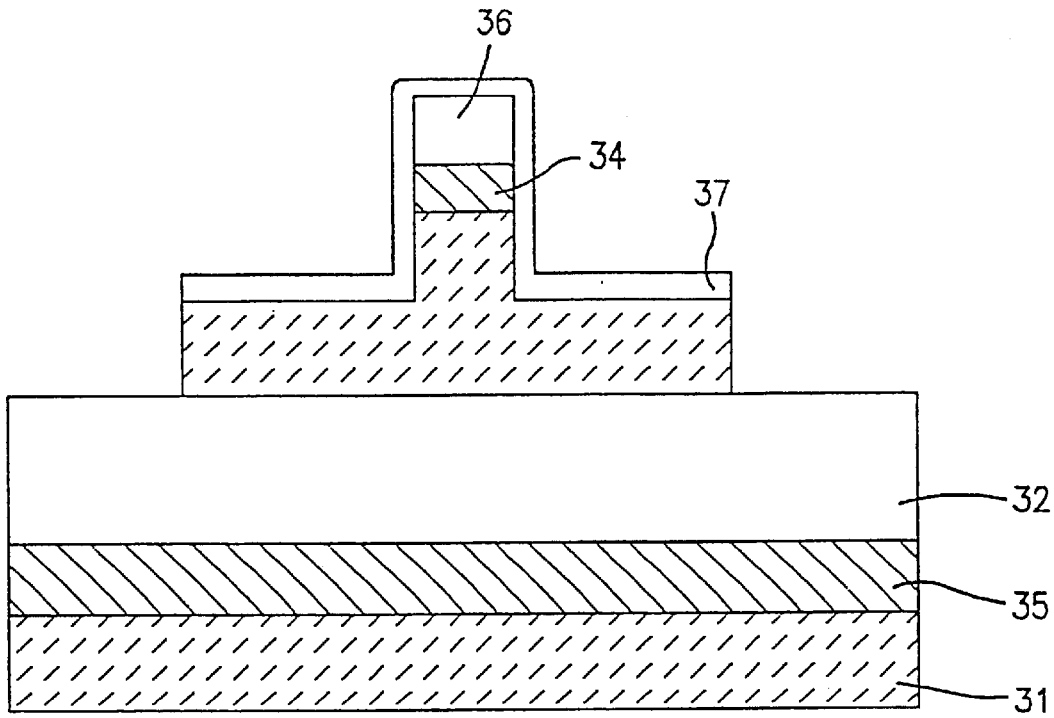
FIG. 34A is a fragmentary cross sectional elevation view taken along 34A–34A' line in FIG. 33 illustrative of a novel body driven SOI-MOS field effect transistor in sixth step in sequential fabrication processes involved in a first fabrication method.
Figure 34B:
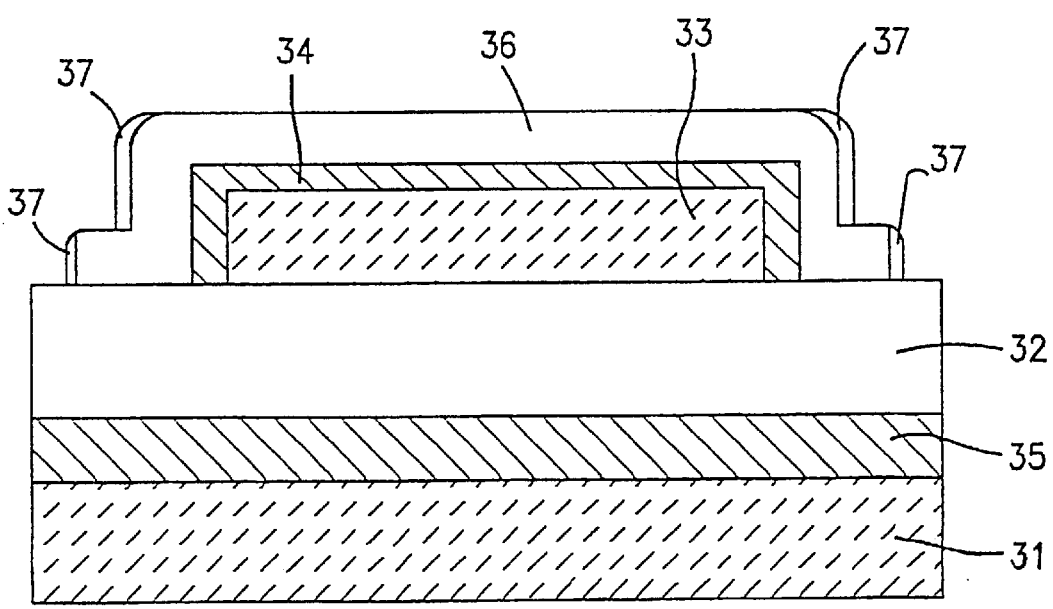
FIG. 34B is a fragmentary cross sectional elevation view taken along 34B–34B' line in FIG. 33 illustrative of a novel body driven SOI-MOS field effect transistor in sixth step in sequential fabrication processes involved in a first fabrication method.

With reference to FIGS. 33, and 34A and 34B, the second oxide film 37 is used as a mask for reactive ion etching to the SOI layer 33 by 20 nanometers.

Figure 35A:
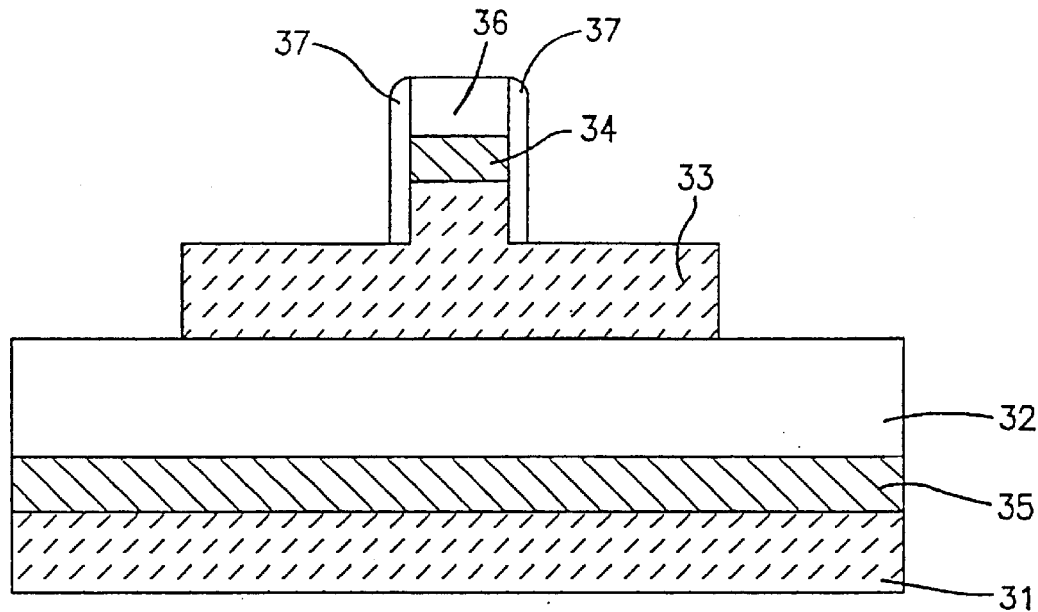
FIG. 35A is a fragmentary cross sectional elevation view illustrative of a novel body driven SOI-MOS field effect transistor in seventh step in sequential fabrication processes involved in a first fabrication method.

With reference to FIG. 35A, the second oxide film 37 is removed by the reactive ion etching.

Figure 35B:
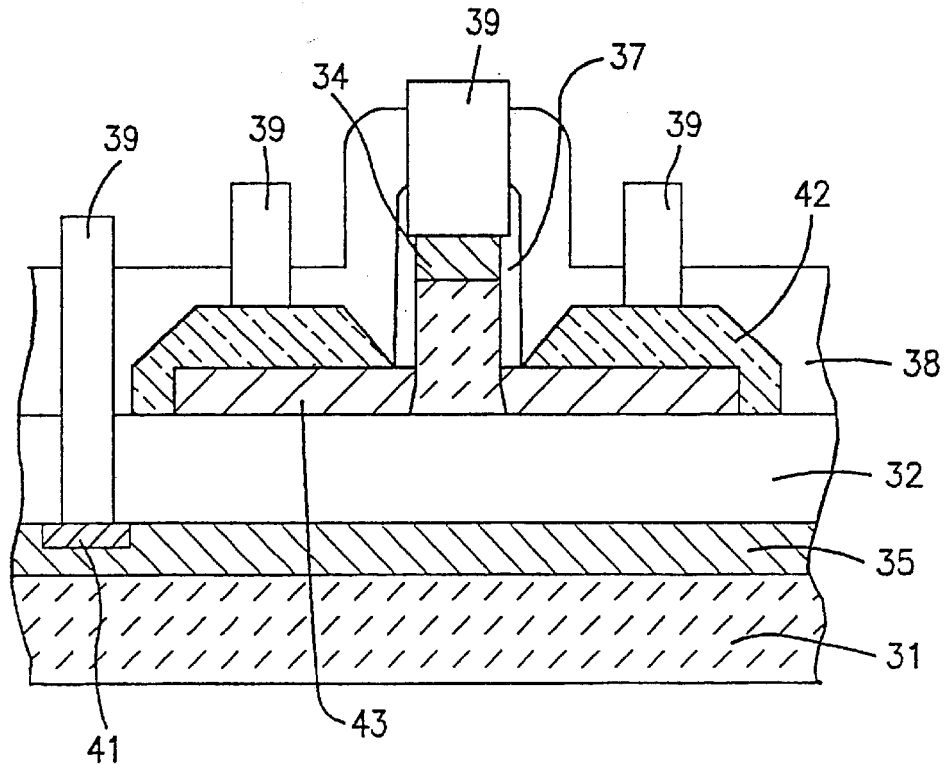
FIG. 35B is a fragmentary cross sectional elevation view illustrative of a novel body driven SOI-MOS field effect transistor in eighth step in sequential fabrication processes involved in a first fabrication method.

With reference to FIG. 35B, an n+-type silicon film 42 containing phosphorus or arsenic and having a thickness of 50 nanometers is epitaxially grown over the SOI layer 33 so that phosphorus or arsenic is diffused into the SOI layer 33 thereby forming source/drain regions 43. An inter-layer insulator 38 having a thickness of 150 nanometers is deposited by a chemical vapor deposition.

Figure 36:
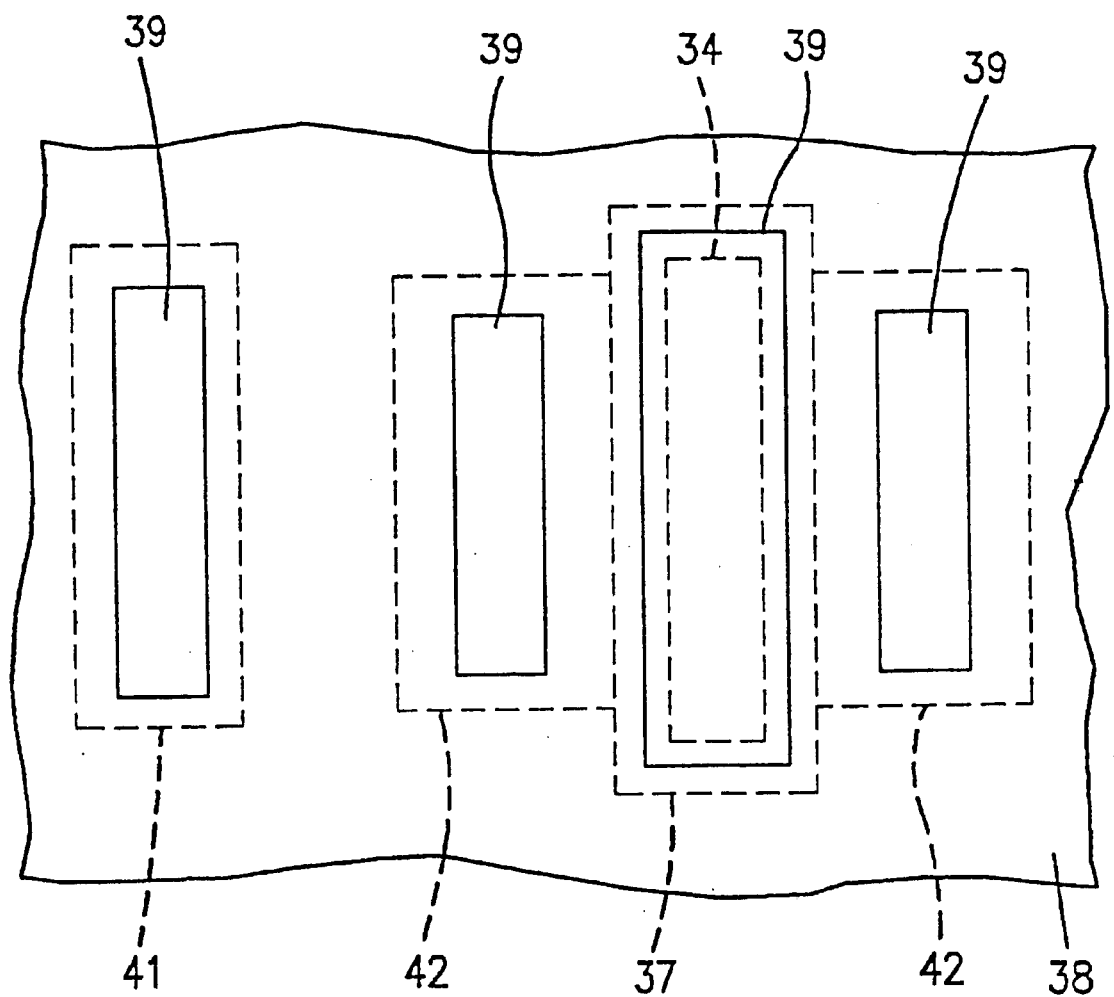
FIG. 36 is a plane view illustrative of a novel body driven SOI-MOS field effect transistor in ninth step in sequential fabrication processes involved in a first fabrication method.

Contact holes are formed in the inter-layer insulator 38 so that interconnections are formed which are connected to the source/drain regions 43, the p+-type region 34 and the bottom p-type region 41. By an ion-implantation, a bottom p+-type region 41 is formed as illustrated in FIG. 36.

Consequently, in accordance with the present invention, the mask pattern 36 is provided over the SOI layer over the insulation layer over the silicon substrate. By use of this mask pattern 36, the SOI layer is selectively etched to reduce a thickness of the portion of the SOI uncovered by the mask pattern 36. Into this region which thickness has been reduced, the first conductivity type impurity is diffused or implanted to form the first conductivity type high impurity diffusion regions whilst the second conductivity type high impurity diffusion region is provided on the unetched region of the SOI layer. Finally, the interconnections are formed to be connected to the first and second conductivity type high impurity diffusion regions. The interconnection connected to the second conductivity type high impurity diffusion region serves as an input terminal.

Figure 37:
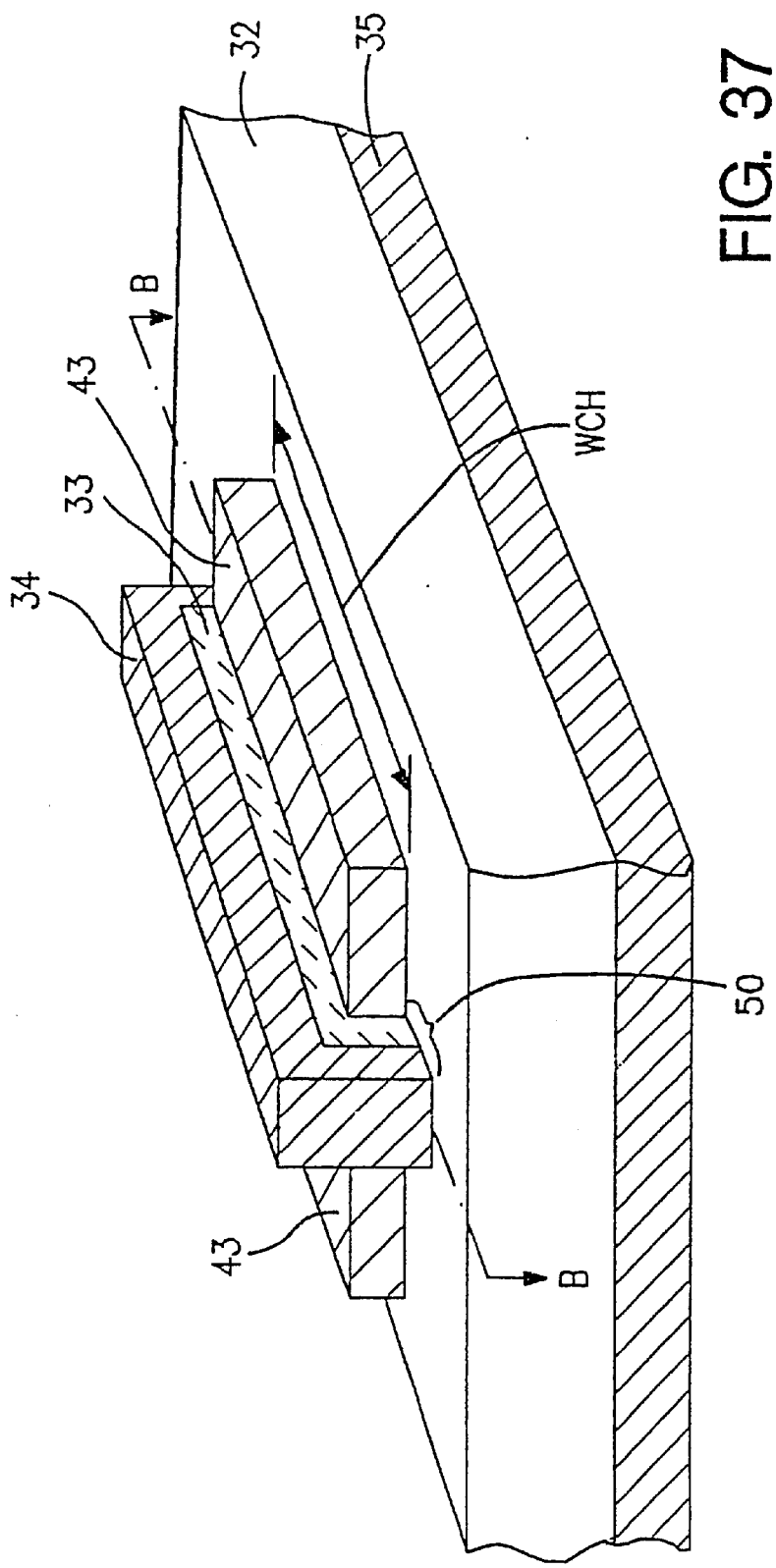
FIG. 37 is a perspective view illustrative of a novel body driven SOI-MOS field effect transistor according to the present invention.
Figure 38:
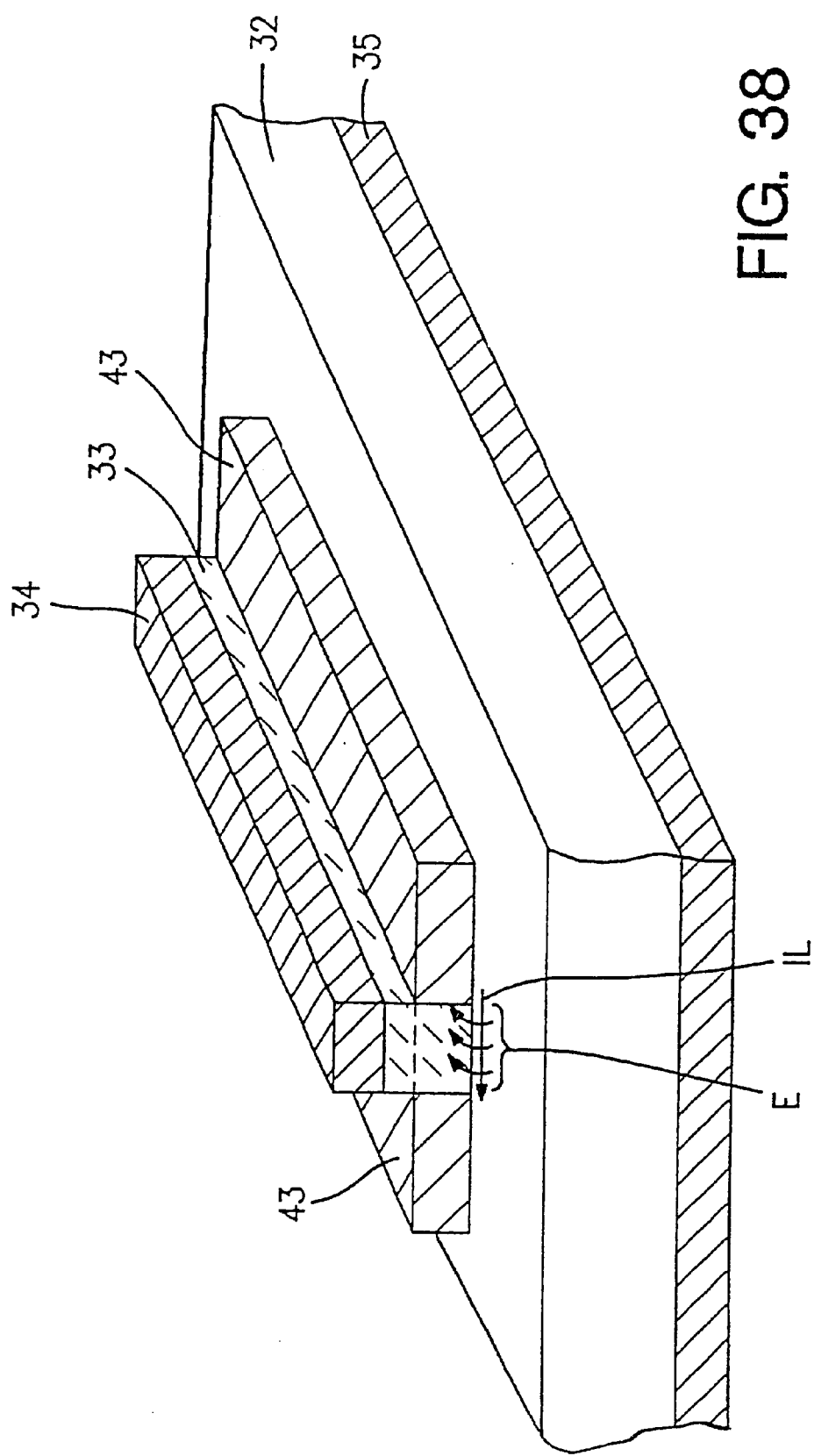
FIG. 38 is a perspective view illustrative of a novel body driven SOI-MOS field effect transistor in FIG. 37.

FIG. 37 is a perspective view illustrative of a novel body driven SOI-MOS field effect transistor according to the present invention. FIG. 38 is a perspective view illustrative of a novel body driven SOI-MOS field effect transistor in FIG. 37. The SOI layer 33 and the p+-region 34 have extending portions 50 in a channel width direction from the channel width Wch so as to suppress leak current IL at channel edges. The channel leak current IL may be caused by a drop in threshold voltage due to a concentration at channel edges of an electric field from the bottom gate electrode 35 as illustrated in FIG. 38. By contrast, as illustrated in FIG. 37, the p+-region 34 extends over the extending region 50 so that since the p+-region 34 has a high impurity concentration, the threshold voltage is high, for which reason it is suppressed to drop the threshold voltage and leak current can be suppressed.

In summary, the low impurity concentration region extends outside the edges of the element region and further the second conductivity type high impurity concentration region extends outside the edges of the low impurity concentration region.

The descriptions will subsequently focus on another fabrication method for the above described novel body-driven SOI-MOS field effect transistor in accordance with the present invention.

Figure 39:
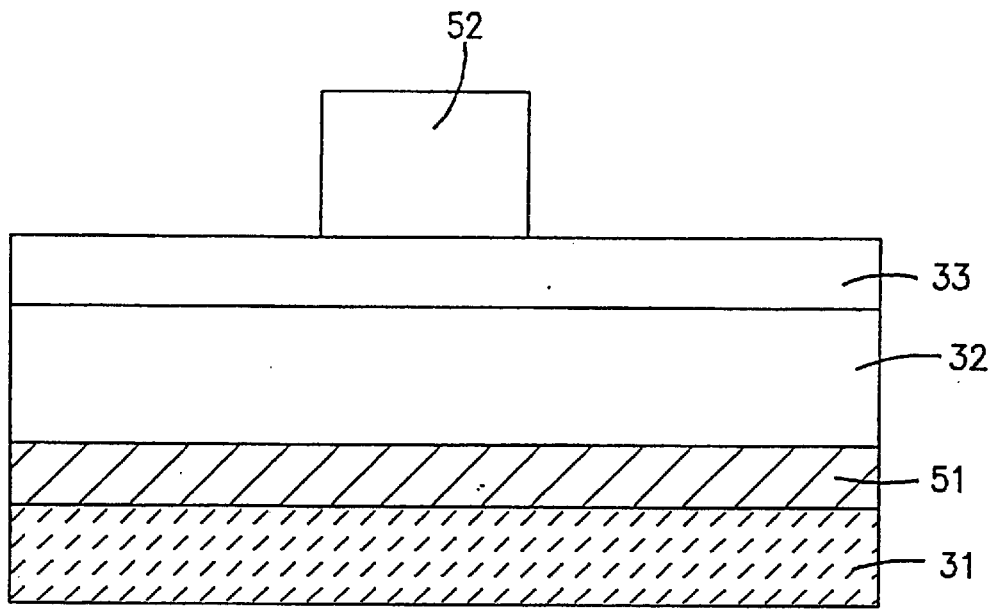
FIG. 39 is a fragmentary cross sectional elevation view illustrative of a novel body driven SOI-MOS field effect transistor in first step in sequential fabrication processes involved in a second fabrication method.

With reference to FIG. 39, a buried oxide film 32 having a thickness of 100 nanometers is formed on a silicon substrate 31. An SOI layer 33 having a thickness of 10 nanometers is formed on the buried oxide film 32. Phosphorus is implanted at 200 keV to $1\times10^{18}$ cm$^{-3}$ for subsequent heat treatment at 800° C. for 10 minutes to form an n-type bottom region 51 in an upper region of the silicon substrate 31. A first CVD oxide film 52 having a thickness of 150 nanometers is deposited by a chemical vapor deposition and then patterned to have a width of 200 nanometers by a photo-lithography and subsequent reactive ion etching. The first CVD oxide film 52 is provided to serve as a dummy pattern for forming a slit in later process.

Figure 40:
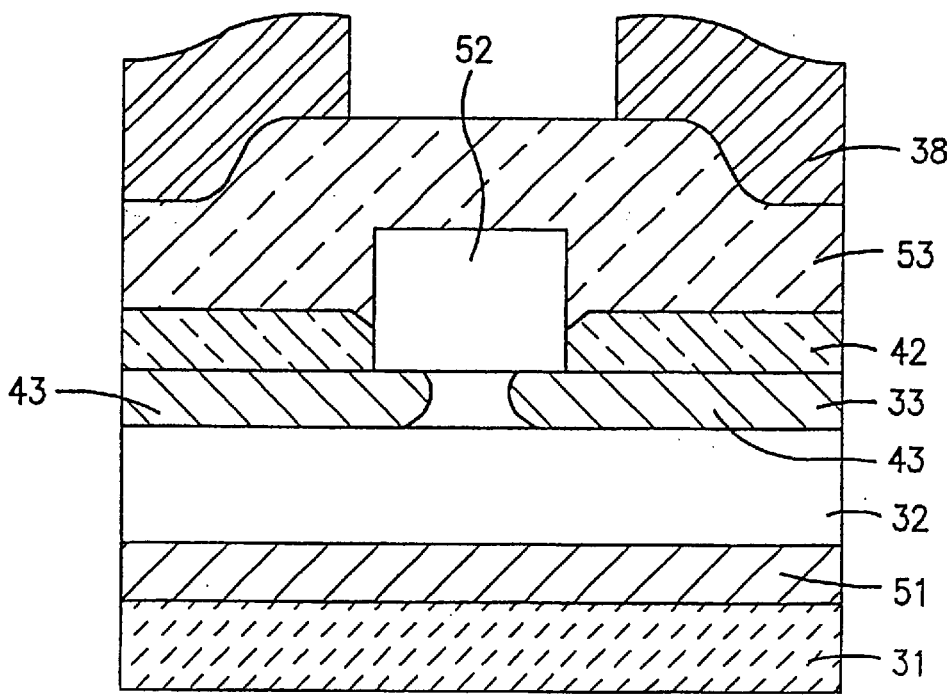
FIG. 40 is a fragmentary cross sectional elevation view illustrative of a novel body driven SOI-MOS field effect transistor in second step in sequential fabrication processes involved in a second fabrication method.

With reference to FIG. 40, an n+-type silicon layer 42 containing phosphorus or arsenic and having a thickness of 50 nanometers is epitaxially grown over the SOI layer 33. A heat treatment is carried out at 800° C. for 10 minutes to cause a diffusion of phosphorus or arsenic from the n+-type silicon layer 42 into the SOI layer 33 to form source/drain regions 43. An $Si_3N_4$ film 53 having a thickness of 200 nanometers is deposited by a chemical vapor deposition. A photo-resist 38 is applied and then patterned to form an opening with a width of 300 nanometers which is positioned over the first CVD oxide film 52.

Figure 41:
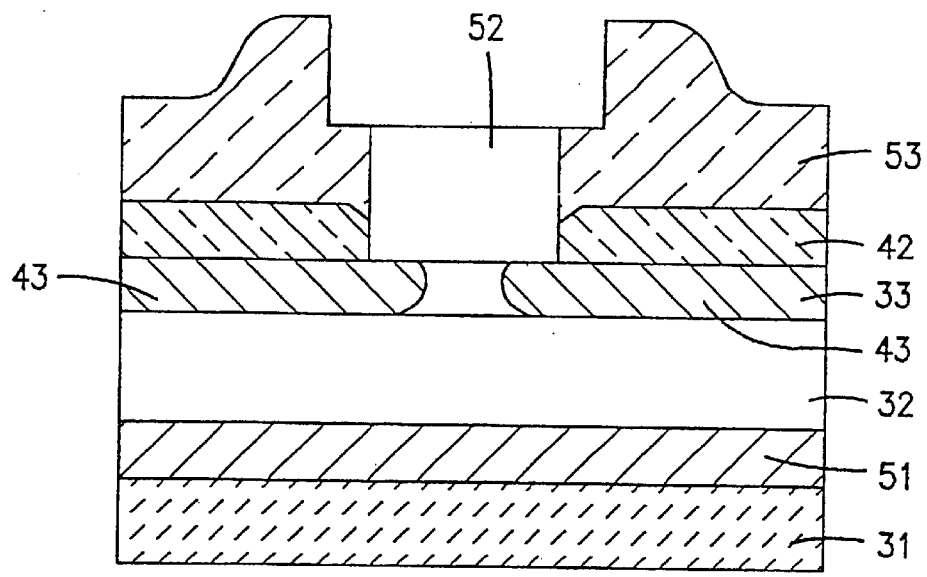
FIG. 41 is a fragmentary cross sectional elevation view illustrative of a novel body driven SOI-MOS field effect transistor in third step in sequential fabrication processes involved in a second fabrication method.
Figure 42:
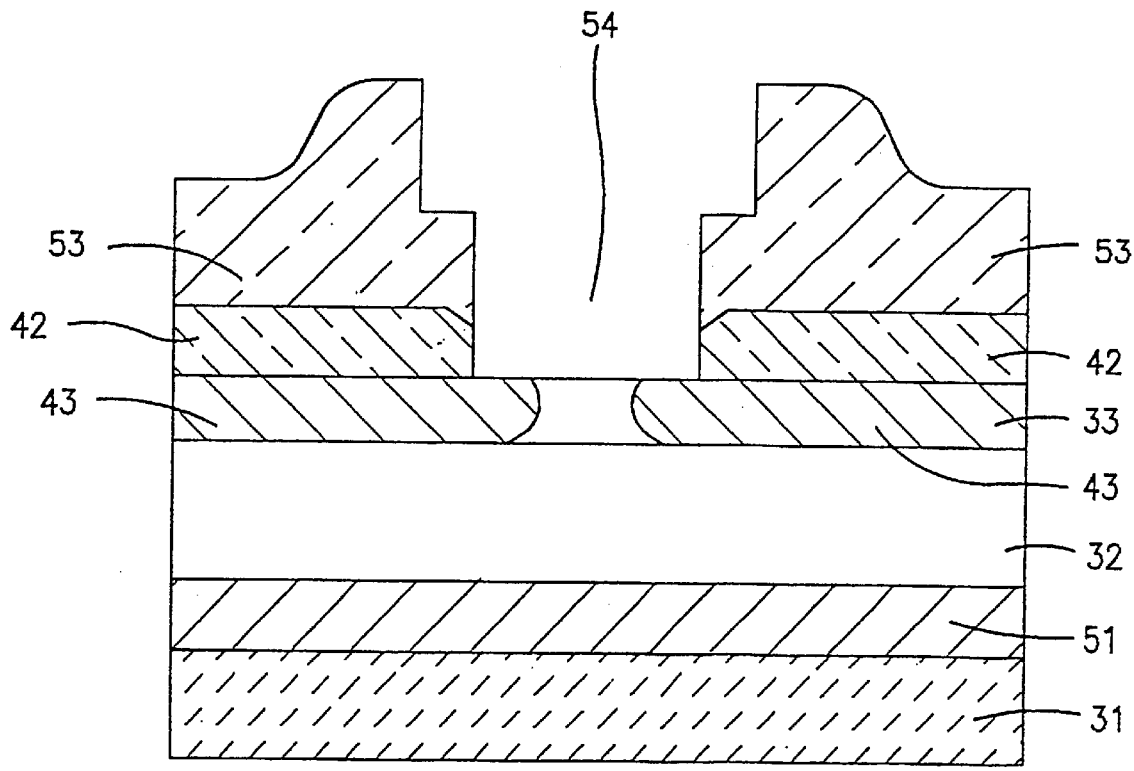
FIG. 42 is a fragmentary cross sectional elevation view illustrative of a novel body driven SOI-MOS field effect transistor in fourth step in sequential fabrication processes involved in a second fabrication method.

With reference to FIG. 41, the photo-resist pattern 38 is used as a mask for carrying out a reactive ion etching on the $Si_3N_4$ film 53 under the opening With reference to FIG. 42, the photo-resist is removed before the first CVD oxide film 52 is removed by a wet etching using hydrofluoric acid solution to form a slit 54.

Figure 43:
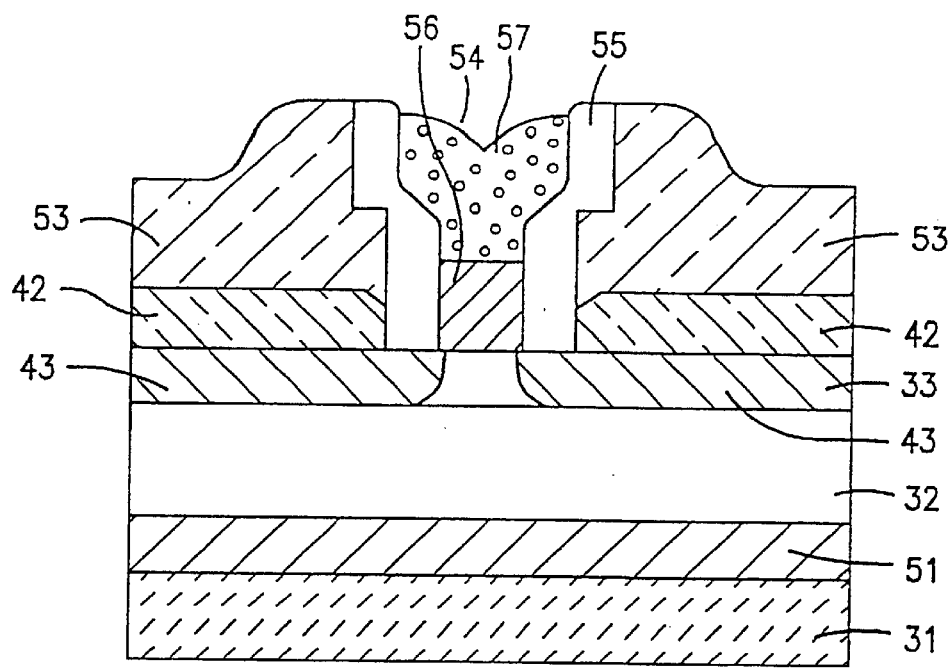
FIG. 43 is a fragmentary cross sectional elevation view illustrative of a novel body driven SOI-MOS field effect transistor in fifth step in sequential fabrication processes involved in a second fabrication method.

With reference to FIG. 43, a second CVD oxide film 55 having a thickness of 100 nanometers and then etched-back by 100 nanometers by a reactive ion etching to leave the second CVD oxide film 55 on the side walls of the slit 54. A p+-type silicon layer 56 having a thickness of 100 nanometers and containing boron is selectively and epitaxially grown on the SOI layer 33 within the slit 54. The p+-type silicon layer 56 serves as a top gate electrode. A TiN film 57 having a thickness of 200 nanometers is deposited and etched back by a reactive ion etching to leave the TiN film 57 within the upper region of the slit 54.

As a modification, in place of metals such as TiN, W, Ta, Mo or metal-semiconductor compounds such as tungsten silicide are available. Further, n+-polysilicon or p+-polysilicon is also available. In order to bury those materials in the slit 54, CVD method, sputtering method and evaporation method are available. As a further modification, it is possible that an ion-implantation may be carried out in order to introduce donor such as phosphorus, arsenic and acceptor such as boron into region other than source/drain regions 43.

Figure 44:
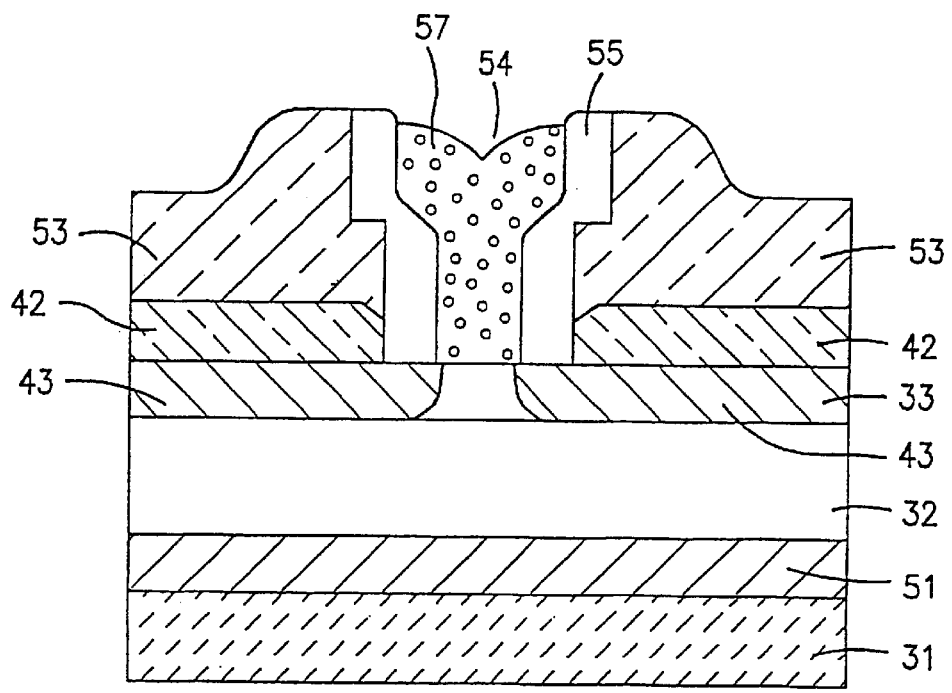
FIG. 44 is a fragmentary cross sectional elevation view illustrative of a novel body driven SOI-MOS field effect transistor in modified fifth step in sequential fabrication processes involved in a second fabrication method.

With reference to FIG. 44, it is further possible to omit the above process for growing the p+-type silicon layer 56 as a furthermore modification. In this case, the structure as illustrated in FIG. 44 can be obtained.

Figure 45:
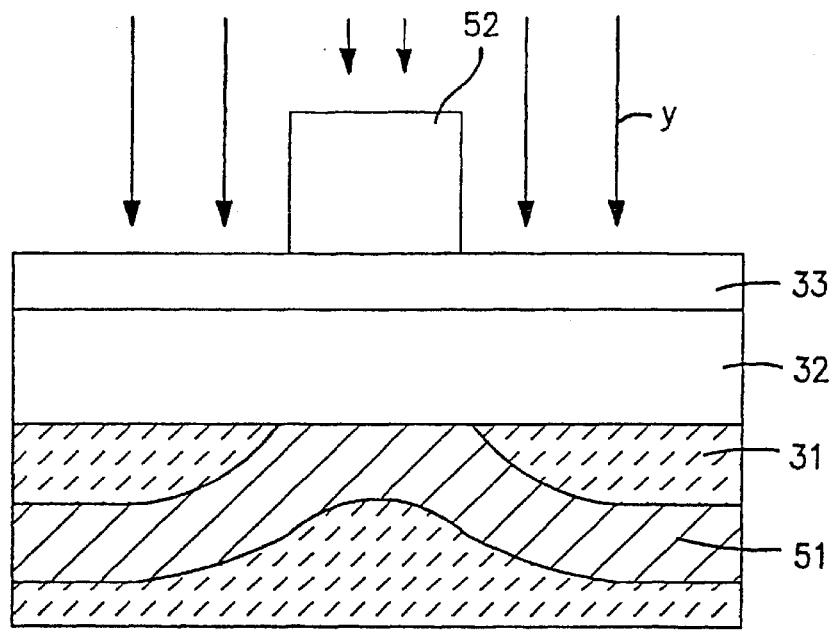
FIG. 45 is a fragmentary cross sectional elevation view illustrative of a novel body driven SOI-MOS field effect transistor in ion-implantation processes involved in a second fabrication method.
Figure 46:
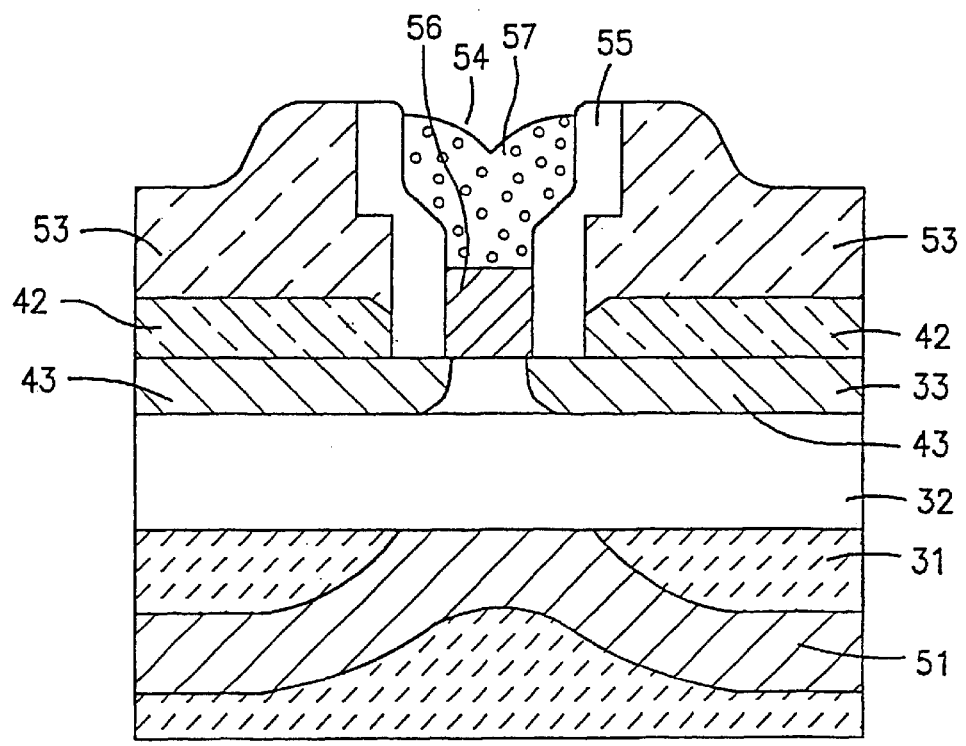
FIG. 46 is a fragmentary cross sectional elevation view illustrative of a novel body driven SOI-MOS field effect transistor in modified fabrication processes involved in a second fabrication method.

With reference to FIGS. 45 and 46, it will be considered that after the first CVD film 52 was patterned, the phosphorus ion implantation for forming the n-type bottom region 51 is carried out at a higher implantation energy, for example, in the range of 250 keV to 1 MeV. In this case, the depth of phosphorus implanted is shallower at positions under the fist CVD film 52 than other positions to due the existence of the first CVD film 52 already patterned. Namely, the n-type bottom region 51 varies in depth as illustrated in FIGS. 45 and 46, so that the n-type bottom region 51 is deeper at positions under the source/drain regions 43 and shallower at positions under the channel region.

The above structure reduces a parasitic capacitance between the source/drain regions 43 and the n-type region 51 whereby the high speed performance of the transistor is improved.

As a modification to the transistor of FIG. 46, the n-type region 51 is separated from the bottom of the insulation layer 32.

As described above, in accordance with the present invention, the dummy pattern 52 is formed over the SOI layer 33 on the insulation layer so that the dummy pattern is used as a mask for ion-implantation, diffusion or growth of impurity containing semiconductor. The first conductivity type high impurity concentration diffusion layers, for example, the n+-type silicon layer 42 and the source/drain regions 43, are provided on the region on which dummy pattern extends. Subsequently, an insulation film, for example, the $Si_3N_4$ film 53 is deposited to cover the dummy pattern before an opening is formed in the insulation film positioned over the dummy pattern so that the dummy pattern is etched by a wet etching through the above opening to thereby form a slit 54. The high impurity concentration semiconductor, metal, metal silicide or n-type or p-type polysilicon is buried into the slit by CVD or sputtering so that the needed convex-shaped transistor structure can be obtained. The high impurity concentration semiconductor is epitaxially grown in the slit 54 so as to serve as a top gate electrode, for which reason impurity distribution in a vertical direction of the top gate electrode can be controlled by controlling the dose of impurity during the epitaxial growth thereof. In the slit 54, metal, metal silicide or polysilicon is buried by the CVD method or sputtering method to form the top gate electrode made of conductive material other than semiconductor.

In accordance with the present invention, the dummy pattern 52 having a certain width is formed over the SOI layer 33 on the insulation layer over the substrate to form a convex structure before the ion-implantation is carried out whereby the impurity is implanted at a shallower level at positions under the dummy pattern 52 than at other positions. The high impurity concentration region 51 is formed at a deeper level at positions under the source/drain regions 43 than that at positions under the channel region, for which reason a parasitic capacitance between the source/drain regions and the high impurity concentration region is reduced and the high speed performance is improved.

In the normal and conventional field effect transistors, if the gate electrode is formed over a gate insulation film prior to the ion-implantation through the top gate electrode and the gate insulation film, then the gate insulation film receives a damage by the ion-implantation whereby the performances of the transistor are deteriorated.

By contrast, in accordance with the present invention, since no gate insulation film is formed, the above novel transistor is inherently free from the above problem in deterioration of the performances due to the damage of the gate insulation film.

As a modification, it is possible that after the semiconductor convex is formed, the above ion-implantation is carried out.

The above present invention is applicable to silicon transistor or silicon device, for which reason the conventional LSI manufacturing apparatus and the conventional fabrication method are available.

The above novel transistor in accordance with the present invention may be used in place in the CMOS circuit or any other circuits having field effect transistors.

The structure of the above novel transistor may be modified to be inverted in the vertical direction or to be rotated in the vertical plane.

Further, the low impurity concentration region extends outside ends of the element region and the second conductivity type high impurity concentration region extends outside the ends of the low impurity concentration region. It is prevented that in the OFF-state any inversion layer is formed at ends of the element region thereby causes leak currents.

The mask pattern is formed over the SOI layer so as to be used as a mask for selectively etching the SOI layer. The first conductivity type impurity is diffused or implanted at high concentration into a thickness-reduced region of the SOI layer to form the first conductivity type high impurity concentration diffusion layers. On the other hand, the second conductivity type high impurity concentration diffusion layer is provided on the non-etched region of the SOI layer. Interconnections are formed to be connected to the first and second conductivity type high impurity layers wherein the interconnection connected to the second conductivity type high impurity concentration layer serves as an input terminal.

Differently from the normal and conventional MOSFET, in accordance with the present invention, the top gate electrode is formed in directly contact with the second conductivity type low impurity region so that a gate-channel capacitance is increased to improve controllability to the channel even through no gate oxide film is formed. The impurity concentration of the substrate is increased to increase the gate-channel capacitance whereby the controllability of the channel by the gate electrode is improved. The threshold voltage is controllable by the bottom gate electrode, for which reason the increase in impurity concentration of the substrate for suppression of the short channel effects can be made independently from setting the threshold voltage.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of fabricating a semiconductor device comprising the steps of:

providing a mask pattern contacting a second conductivity type impurity layer in contact with a first region of a semiconductor layer over an insulation layer;

selectively etching said second conductivity type impurity layer and said semiconductor layer by use of said mask pattern to reduce a thickness of a second region of said semiconductor layer other than said first region;

subsequent to said etching step, providing a contact hole and therethrough another second conductivity type impurity containing region apart from said first region of said semiconductor layer;

providing a first conductivity impurity containing layer on said second region of said semiconductor layer; and providing terminals on said first and second conductivity type impurity containing layers.

2. A method of fabricating a semiconductor device comprising the steps of:

forming a dummy pattern on a first part of a semiconductor-on-insulator layer (a "SOI layer");

providing a first conductivity type high impurity concentration diffusion layer on a second part of the SOI layer other than said first part of the SOI layer covered by said dummy pattern, a lower planar surface of said first conductivity diffusion layer being co-planar with a lower planar surface of said dummy pattern;

depositing an insulation film which covers said dummy pattern;

etching an opening in said insulation film over said dummy pattern in order to remove said dummy pattern by etching through said opening and thereby forming a slit; and providing a semiconductor containing an impurity in said slit.

3. A method of fabricating a semiconductor device comprising the steps of:

forming a dummy pattern on a first part of a semiconductor-on-insulator layer (a "SOI layer");

providing a first conductivity type high impurity concentration diffusion layer on a second part of the SOI layer other than said first part of the SOI layer covered by said dummy pattern, a lower planar surface of said first conductivity diffusion layer being co-planar with a lower planar surface of said dummy pattern;

depositing an insulation film which covers said dummy pattern;

etching an opening in said insulation film over said dummy pattern in order to remove said dummy pattern by etching through said opening and thereby forming a slit; and providing a metal in said slit.

* * * * *